(12) United States Patent
Yamamoto

(10) Patent No.: US 10,789,165 B2
(45) Date of Patent: Sep. 29, 2020

(54) DATA PROCESSING APPARATUS, AND DATA PROCESSING METHOD

(71) Applicant: Saturn Licensing LLC, New York, NY (US)

(72) Inventor: Makiko Yamamoto, Tokyo (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/754,331

(22) PCT Filed: Oct. 27, 2016

(86) PCT No.: PCT/JP2016/081808
§ 371 (c)(1),
(2) Date: Feb. 22, 2018

(87) PCT Pub. No.: WO2017/082060
PCT Pub. Date: May 18, 2017

(65) Prior Publication Data
US 2018/0232306 A1 Aug. 16, 2018

(30) Foreign Application Priority Data
Nov. 10, 2015 (JP) ................... 2015-220516

(51) Int. Cl.
*G06F 12/00* (2006.01)
*G06F 12/06* (2006.01)
(Continued)

(52) U.S. Cl.
CPC .......... *G06F 12/0607* (2013.01); *G06F 7/582* (2013.01); *H03M 13/2742* (2013.01);
(Continued)

(58) Field of Classification Search
CPC ... G06F 12/0607; G06F 7/582; H04L 1/0071; H04L 1/0041; H04L 1/0058
See application file for complete search history.

(56) References Cited

U.S. PATENT DOCUMENTS 5,276,826 A * 1/1994 Rau .................. G06F 12/0607
710/60
6,564,343 B1 * 5/2003 Yamashita ........ H03M 13/2703
714/701
(Continued)

FOREIGN PATENT DOCUMENTS

WO 2015/076638 A1 5/2015

OTHER PUBLICATIONS

International Search Report dated Dec. 13, 2016, in PCT/JP2016/081808 filed Oct. 27, 2016.
(Continued)

*Primary Examiner* — Prasith Thammavong
(74) *Attorney, Agent, or Firm* — Oblon, McClelland, Maier & Neustadt, L.L.P.

(57) ABSTRACT

The present technique relates to a data processing apparatus, and a data processing method each of which enables a valid address to be more reliably produced in interleave. In a data processing apparatus, a frequency interleaver for carrying out frequency interleave calculates a first bit stream produced by a first pseudo random number generating portion configured to produce a random bit stream, a second bit stream produced by a second pseudo random number generating portion configured to produce a random bit stream, and an additional bit produced by a bit producing portion configured to alternately produce a bit as 0 and a bit as 1. As a result, in producing a write address or a read address including a random bit stream, the bit as 0 and the bit as 1 are alternately repeated as the most, significant bit in the random bit stream. The present technique, for example, can be applied to a frequency interleaver for carrying out frequency interleave.

12 Claims, 20 Drawing Sheets

(51) Int. Cl.
*G06F 7/58* (2006.01)
*H03M 13/27* (2006.01)
*H04L 1/00* (2006.01)
*H04L 27/26* (2006.01)

(52) U.S. Cl.
CPC ... *H03M 13/2746* (2013.01); *H03M 13/2789* (2013.01); *H04L 1/0071* (2013.01); *G06F 2212/1016* (2013.01); *H04L 1/0041* (2013.01); *H04L 1/0058* (2013.01); *H04L 27/2601* (2013.01)

(56) References Cited

U.S. PATENT DOCUMENTS

| | | | | |
|---|---|---|---|---|
| 6,603,412 | B2* | 8/2003 | Gatherer | H03M 13/271 341/50 |
| 6,668,350 | B1* | 12/2003 | Kim | H03M 13/2703 711/217 |
| 8,170,091 | B2 | 5/2012 | Taylor et al. | |
| 2002/0035715 | A1* | 3/2002 | Hatakeyama | G06F 9/342 714/788 |
| 2003/0149849 | A1* | 8/2003 | Kim | H03M 13/271 711/157 |
| 2003/0177432 | A1* | 9/2003 | Yamamoto | H03M 13/2725 714/755 |
| 2004/0246888 | A1* | 12/2004 | Peron | H03M 13/2792 370/208 |
| 2006/0047886 | A1* | 3/2006 | Leaback | G06F 12/0607 711/5 |
| 2006/0064540 | A1* | 3/2006 | Blodgett | G06F 12/0215 711/105 |
| 2007/0139428 | A1* | 6/2007 | Berkeman | H03M 13/271 345/565 |
| 2009/0110094 | A1* | 4/2009 | Taylor | H04L 1/0071 375/260 |
| 2009/0110095 | A1 | 4/2009 | Taylor et al. | |
| 2009/0180034 | A1* | 7/2009 | Treigherman | H03M 13/2732 348/726 |
| 2009/0296838 | A1 | 12/2009 | Atungsiri et al. | |
| 2009/0296840 | A1 | 12/2009 | Atungsiri et al. | |
| 2009/0315742 | A1* | 12/2009 | Breiling | H03M 13/2707 341/81 |
| 2010/0042899 | A1* | 2/2010 | Pu | H03M 13/271 714/763 |
| 2012/0099665 | A1 | 4/2012 | Taylor et al. | |
| 2012/0250777 | A1* | 10/2012 | Peron | H04L 5/0044 375/260 |
| 2015/0049828 | A1 | 2/2015 | Baek et al. | |
| 2015/0146804 | A1 | 5/2015 | Baek et al. | |
| 2015/0155975 | A1* | 6/2015 | Baek | H04L 1/0083 375/295 |
| 2016/0112234 | A1 | 4/2016 | Baek et al. | |
| 2017/0078130 | A1 | 3/2017 | Baek et al. | |

OTHER PUBLICATIONS

ATSC Candidate Standard: Physical Layer Protocol, Doc. S32-230r21, Advanced Television Systems Committee, Sep. 28, 2015, pp. 1-228.

Lachlan Michael et al., "Modulation and Coding for ATSC 3.0", Broadband Multimedia Systems and Broadcasting (BMSB), IEEE International Symposium, Jun. 19, 2015, ( 8 total pages).

Extended European Search Report dated Oct. 10, 2018 in corresponding European Patent Application No. 16864024.1, 13 pages.

Hossejn Afshari et al., "A Novel Symbol Interleaver Address Generation Architecture for DVB-T Modulator", Prog. International Symposium on Communications and Information Technologies 2006, IEEE, XP 31068308, Oct. 1, 2006, pp. 989-993.

"ATSC Standard: Physical Layer Protocol (A322)", ATSC, Doc. A322:2016, Sep. 7, 2016, XP 55405794, pp. 1-258.

* cited by examiner

FIG. 6

PRODUCTION OF $R_i$ $i=0,1$ : $R'_i[N_r-2, N_r-3, \ldots, 1, 0] = [0, 0, \ldots, 0, 0]$, $i=2$ : $R'_i[N_r-2, N_r-3, \ldots, 1, 0] = [0, 0, \ldots, 0, 1]$, $2 < i < M_{max}$ : $[R'_i[N_r-3, N_r-4, \ldots, 1, 0] = R'_{i-1}[N_r-2, N_r-3, \ldots, 2, 1]$;

in the 8K mode : $R'_i[11] = R'_{i-1}[0] \oplus R'_{i-1}[1] \oplus R'_{i-1}[4] \oplus R'_{i-1}[6]$, in the 16K mode : $R'_i[12] = R'_{i-1}[0] \oplus R'_{i-1}[1] \oplus R'_{i-1}[4] \oplus R'_{i-1}[5] \oplus R'_{i-1}[9] \oplus R'_{i-1}[11]$, in the 32K mode : $R'_i[13] = R'_{i-1}[0] \oplus R'_{i-1}[1] \oplus R'_{i-1}[2] \oplus R'_{i-1}[5] \oplus R'_{i-1}[9] \oplus R'_{i-1}[11]$, where $N_r = \log_2 M_{max}$ and the parameter $M_{max}$ is defined in FIG. 7

FIG.7

| FFT Mode | $M_{max}$ |
|---|---|
| 8K | 8192 |
| 16K | 16384 |
| 32K | 32768 |

FIG. 8

Wire permutations for the 8K mode

| R'$_i$ bit positions | 11 | 10 | 9 | 8 | 7 | 6 | 5 | 4 | 3 | 2 | 1 | 0 |
|---|---|---|---|---|---|---|---|---|---|---|---|---|
| R$_i$ bit positions (even) | 5 | 11 | 3 | 0 | 10 | 8 | 6 | 9 | 2 | 4 | 1 | 7 |
| R$_i$ bit positions (odd) | 8 | 10 | 7 | 6 | 0 | 5 | 2 | 1 | 3 | 9 | 4 | 11 |

FIG. 9

| $R'_i$ bit positions | 12 | 11 | 10 | 9 | 8 | 7 | 6 | 5 | 4 | 3 | 2 | 1 | 0 |
|---|---|---|---|---|---|---|---|---|---|---|---|---|---|
| $R_i$ bit positions (even) | 8 | 4 | 3 | 2 | 0 | 11 | 1 | 5 | 12 | 10 | 6 | 7 | 9 |
| $R_i$ bit positions (odd) | 7 | 9 | 5 | 3 | 11 | 1 | 4 | 0 | 2 | 12 | 10 | 8 | 6 |

Wire permutations for the 16K mode

F I G . 10

Wire permutations for the 32K mode

| R'$_i$ bit positions | 13 | 12 | 11 | 10 | 9 | 8 | 7 | 6 | 5 | 4 | 3 | 2 | 1 | 0 |
|---|---|---|---|---|---|---|---|---|---|---|---|---|---|---|
| R$_i$ bit positions | 6 | 5 | 0 | 10 | 8 | 1 | 11 | 12 | 2 | 9 | 4 | 3 | 13 | 7 |

FIG. 11

PRODUCTION OF $G_K$ $k=0$ : $G_k[N_r-1, N_r-2, \ldots, 1, 0] = [1, 1, \ldots, 1, 1]$, $0 < k < \lceil L_F/2 \rceil$ : $\{G_k[N_r-2, N_r-3, \ldots, 1, 0] = G_{k-1}[N_r-1, N_r-2, \ldots, 2, 1]$;

in the 8K mode : $G_k[12] = G_{k-1}[0] \oplus G_{k-1}[1] \oplus G_{k-1}[4] \oplus G_{k-1}[5] \oplus G_{k-1}[9] \oplus G_{k-1}[11]$, in the 16K mode : $G_k[13] = G_{k-1}[0] \oplus G_{k-1}[1] \oplus G_{k-1}[2] \oplus G_{k-1}[12]$, in the 32K mode : $G_k[14] = G_{k-1}[0] \oplus G_{k-1}[1] \oplus G_{k-1}[13]\}$.

where $\oplus$ represents an XOR operation.

F I G . 1 2

ADDRESS PRODUCTION EXPRESSION BEFORE CORRECTION for (i=0; i<$M_{max}$; i=i+1) {

$H_i(p) = [(i \bmod 2) 2^{N_r - 1} + \sum_{j=0}^{N_r - 2} R_i[j]2^j + \sum_{j=0}^{N_r - 1} G_{[i/2]}[j]2^j] \bmod M_{max};$ if($H_i(p) < N_{data}$) p=p+1; } i : SYMBOL NUMBER WITHIN SUB-FRAME
p : CELL NUMBER WITHIN SYMBOL
i : ADDRESS INDEX
$N_r$ : 13 (8K mode), 14 (16K mode), 15 (32K mode)
$M_{max}$ : 8192 (8K mode), 16384 (16K mode), 32768 (32K mode)

FIG. 13

CONCRETE EXAMPLE

ASSUMPTION
- i ; even
- $R_i = 3000$
- $R_{i+1} = 100$
- $G_k = 2000$ (fixed)
- $N_{data} = 4500$ ADDRESS PRODUCTION EXPRESSION BEFORE CORRECTION IS APPLIED
- $R_i : H_i(p) = 3000 + 2000 = 5000 \pmod{8192}$
- $R_{i+1} : H_i(p) = 4096 + 100 + 2000 = 6196 \pmod{8192}$
- Both of $R_i$ and $R_{i+1}$ are more than 4500.

FIG. 14

ADDRESS PRODUCTION EXPRESSION AFTER CORRECTION for (i=0; i<M_{max}; i=i+1) {

$H_l(p) = [(i \bmod 2)2^{N_r-1} + \sum_{j=0}^{N_r-2} R_i[j]2^j] \oplus \sum_{j=0}^{N_r-1} G_{[l/2]}[j]2^j;$ if (H_l(p) <N_{data}) p=p+1;} l: SYMBOL NUMBER WITHIN SUB-FRAME
p: CELL NUMBER WITHIN SYMBOL
i: ADDRESS INDEX
$N_r$: 13 (8K mode), 14 (16K mode), 15 (32K mode)
$M_{max}$: 8192 (8K mode), 16384 (16K mode), 32768 (32K mode)
⊕: exclusive or

FIG. 15

CONCRETE EXAMPLE

ASSUMPTION
- i ; even
- $R_i = 3000$
- $R_{i+1} = 100$
- $G_k = 2000$ (fixed)
- $N_{data} = 4500$ ADDRESS PRODUCTION EXPRESSION AFTER CORRECTION IS APPLIED
- $R_i : H_i(p) = 3000$ XOR $2000 = 3176$
- $R_{i+1} : H_i(p) = (4096 + 100)$ XOR $2000 = 6068$
- In this case $R_i$ is less than 4500, and $R_{i+1}$ is over 4500.

FIG. 17

OTHER ADDRESS PRODUCTION EXPRESSIONS AFTER CORRECTION

A.

$H_i(p) = (i \bmod 2) 2^{N_r - 1} + [\sum_{j=0}^{N_r-2} R_i[j]2^j + \sum_{j=0}^{N_r-2} G_{\lfloor i/2 \rfloor}[j]2^j] (\bmod W_{max}/2);$

B.

$H_i(p) = (i \bmod 2) 2^{N_r - 1} + [\sum_{j=0}^{N_r-2} R_i[j]2^j \oplus \sum_{j=0}^{N_r-2} G_{\lfloor i/2 \rfloor}[j]2^j];$

DATA PROCESSING APPARATUS, AND DATA PROCESSING METHOD

TECHNICAL FIELD

The present technique relates to a data processing apparatus and a data processing method, and more particularly to a data processing apparatus and a data processing method each of which enables production of a valid address to be more reliably carried out in interleave.

BACKGROUND ART

In a field of digital broadcasting, it is known to carry out interleave for dispersing transmission data in a time direction and in a frequency direction in order to avoid an influence of a burst error or the like at the time of transmission of data on a reception side (for example, refer to NPL 1).

CITATION LIST

Non Patent Literature

[NPL 1]
ATSC Candidate Standard: Physical Layer Protocol (Doc. S32-230r2128 September 2015)

SUMMARY

Technical Problem

Incidentally, in interleave such as frequency interleave, an address of a memory for interleave is produced, and writing of data or reading of data is carried out, thereby rearranging the data. However, since a valid address cannot be produced at the time of production of the address in some cases, a proposal for carrying out more reliably the production of the valid address has been requested.

The present technique has been made in the light of such a situation, and enables the production of the valid address to be more reliably carried out in the interleave.

Solution to Problem

A data processing apparatus of a first aspect of the present technique includes a frequency interleaver that includes an interleaver memory for writing and reading data, and an address producing portion configured to produce a write address and a read address, and that writes the data to the interleaver memory in accordance with the write address and reads out the data from the interleaver memory in accordance with the read address, thereby carrying out frequency interleave. The address producing portion includes a first pseudo random number generating portion configured to produce a first bit stream as a random bit stream, a second pseudo random number generating portion configured to produce a second bit stream as a random bit stream, and a bit producing portion configured to alternately produce a bit as 0 and a bit as 1 as an additional bit added to a most significant bit of a random bit stream. When the first bit stream, the second bit stream, and the additional bit are calculated to produce the write address or the read address including the random bit stream, the bit as 0 and the bit as 1 are alternately repeated as the most significant bit in the random bit stream.

The data processing apparatus of the first aspect of the present technique may be an independent apparatus or an internal block configuring one apparatus. In addition, a data processing method of the first aspect of the present technique is a data processing method corresponding to the data processing apparatus described above of the first aspect of the present technique.

In the data processing apparatus and the data processing method of the first aspect of the present technique, when the first bit stream produced by the first pseudo random number generating portion configured to produce the random bit stream, the second bit stream produced by the second pseudo random number generating portion configured to produce the random bit stream, and the additional bit produced by the bit producing portion configured to alternately produce the bit as 0 and the bit as 1 are calculated to produce the write address or the read address including the random bit stream, the bit as 0 and the bit as 1 are alternately repeated as the most significant bit in the random bit stream.

A data processing apparatus of a second aspect of the present technique includes a frequency deinterleaver that includes a deinterleaver memory for writing and reading data, and an address producing portion configured to produce a write address and a read address, and that writes the data to the deinterleaver memory in accordance with the write address and reads out the data from the deinterleaver memory in accordance with the read address, thereby carrying out frequency deinterleave. The address producing portion includes a first pseudo random number generating portion configured to produce a first bit stream as a random bit stream, a second pseudo random number generating portion configured to produce a second bit stream as a random bit stream, and a bit producing portion configured to alternately produce a bit as 0 and a bit as 1 as an additional bit added to a most significant bit of a random bit stream. When the first bit stream, the second bit stream, and the additional bit are calculated to produce the write address or the read address including the random bit stream, the bit as 0 and the bit as 1 are alternately repeated as the most significant bit in the random bit stream.

The data processing apparatus of the second aspect of the present technique may be an independent apparatus or an internal block configuring one apparatus. In addition, a data processing method of the second aspect of the present technique is a data processing method corresponding to the data processing apparatus described above of the second aspect of the present technique.

In the data processing apparatus and the data processing method of the second aspect of the present technique, when the first bit stream produced by the first pseudo random number generating portion configured to produce the random bit stream, the second bit stream produced by the second pseudo random number generating portion configured to produce the random bit stream, and the additional bit produced by the bit producing portion configured to alternately produce the bit as 0 and the bit as 1 are calculated to produce the write address or the read address including the random bit stream, the bit as 0 and the bit as 1 are alternately repeated as the most significant bit in the random bit stream.

Advantageous Effect of Invention

According to the first aspect and the second aspect of the present technique, in the interleave, the production of the valid address can be more reliably carried out.

It should be noted that the effect described herein is not necessarily limited, and any of the effects described in the present disclosure may also be offered.

BRIEF DESCRIPTION OF DRAWINGS

FIG. 6 is a view explaining details of production of a bit stream for an address.

FIG. 7 is a diagram depicting a relationship between an FFT mode and a value of $M_{max}$.

FIG. 8 is a diagram depicting an example of conversion of a bit stream in an 8K mode.

FIG. 9 is a diagram depicting an example of conversion of a bit stream in a 16K mode.

FIG. 10 is a diagram depicting an example of conversion of a bit stream in a 32K mode.

FIG. 11 is a view explaining details of production of a bit stream for an address.

FIG. 12 is a view depicting an address production expression before correction.

FIG. 13 is a view depicting a concrete example of the address production expression before correction.

FIG. 14 is a view depicting an example of an address production expression after correction.

FIG. 15 is a view depicting a concrete example of the address production expression after correction.

FIG. 17 is a view depicting an example of other address production expressions after the correction.

DESCRIPTION OF EMBODIMENT

Figure 1:
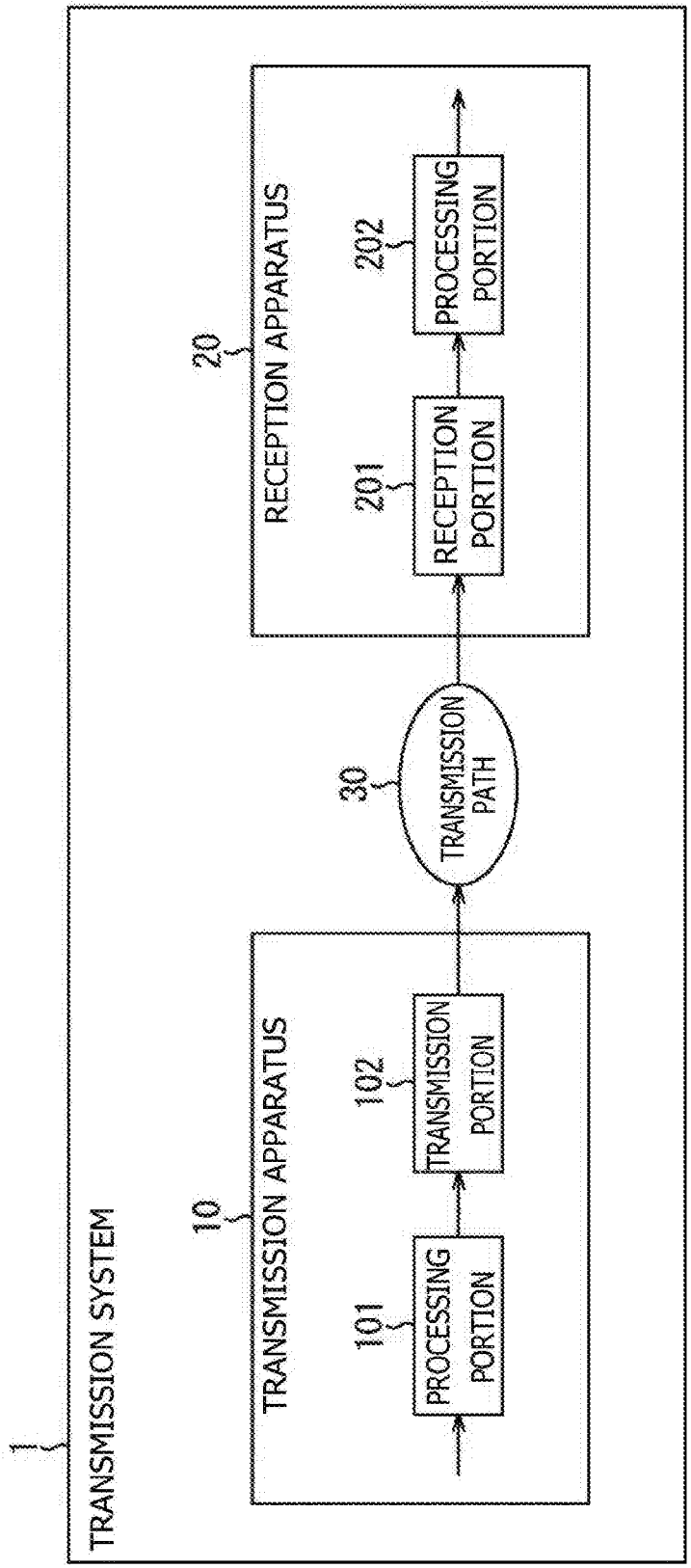
FIG. 1 is a block diagram depicting an example of a configuration of an embodiment of a transmission system to which the present technique is applied.

Hereinafter, an embodiment of the present technique will be described with reference to the drawings. It should be noted that the description will be given in the following order. In addition, a symbol of "+" described in "o" in the drawings or expressions means exclusive OR and is described as "XOR (EXOR)" in the present description.
1. Configuration of system
2. Outline of frequency interleave
3. Address production expression of frequency interleave
4. Outline of frequency deinterleave
5. Flow of processing on transmission side and on reception side
6. Modified changes
7. Configuration of computer <1. Configuration of System>
(Example of Configuration of Transmission System)

FIG. 1 is a block diagram depicting a configuration of an embodiment of a transmission system to which the present technique is applied. It should be noted that the system means a logical set of a plurality of apparatuses.

In FIG. 1, a transmission system 1 includes a transmission apparatus 10 and a reception apparatus 20. In the transmission system 1, data transmission complying with the standards, for digital broadcasting, such as ATSC (Advanced Television Systems Committee) 3.0 is carried out.

The transmission apparatus 10 is a transmitter supporting the standards, for the digital broadcasting, such as ATSC3.0, and transmits contents through a transmission path 30. For example, the transmission apparatus 10 transmits a broadcasting stream including (components of) the video, the audio and the like, and the signaling constituting contents such as a television program in the form of a digital broadcasting signal through the transmission path 30.

The transmission apparatus 10 includes a processing portion 101 and a transmission portion 102.

The processing portion 101 executes necessary processing for transmission data inputted thereto from a circuit in a preceding stage and supplies the resulting transmission data to the transmission portion 102. In this case, for example, after the transmission data is encapsulated in a transmission packet, and error correction encoding processing such as BCH encoding, or LDPC (Low Density Parity Check) encoding is executed, bit interleave is carried out. In addition, quadrature modulation corresponding to a predetermined modulation system is carried out, and the interleave in a time direction or in a frequency direction is carried out for the resulting data. Then, the data after the interleave is supplied to the transmission portion 102.

The transmission portion 102 executes necessary processing for the data supplied thereto from the processing portion 101, and transmits the resulting data in the form of a digital broadcasting signal. In this case, for example, the processing regarding not only IFFT (Inverse Fast Fourier Transform), but also a symbol or preamble of a pilot, and guard interval is executed, an OFDM (Orthogonal Frequency Division Multiplexing) signal corresponding to the frame is produced, and is transmitted through the transmission path 30.

The reception apparatus 20 is a receiver supporting the standards, for the digital broadcasting, such as ATSC3.0, and receives the contents transmitted thereto from the transmission apparatus 10 through the transmission path 30 and outputs the contents. For example, the reception apparatus 20 receives the digital broadcasting signal from the transmission apparatus 10, and processes (components of) the video or the audio, and the signaling included in a broadcasting stream to reproduce the video or the voice of the contents of the television broadcasting or the like.

The reception apparatus 20 includes a reception portion 201 and a processing portion 202.

The reception portion 201 receives the digital broadcasting signal transmitted thereto through the transmission path 30 and executes the necessary processing for the digital broadcasting signal, and supplies the resulting digital broadcasting signal to the processing portion 202. In this case, for example, the processing regarding not only FFT (Fast Fourier Transform), but also a symbol or preamble of a pilot, and a guard interval is executed. Then, the data is extracted from the OFDM signal transmitted through the transmission path 30.

The processing portion 202 executes necessary processing for the data supplied thereto from the reception portion 201, and outputs the resulting data to a circuit in a subsequent stage. In this case, for example, the deinterleave in the frequency direction or in the time direction is carried out for the data sent from the reception portion 201. In addition, after quadrature demodulation corresponding to a predetermined demodulation system is carried out, and bit deinterleave is carried out for the resulting data, error correction decoding processing such as LDPC decoding or the BCH decoding is executed. Then, the transmission data stored in the transmission packet is extracted and is outputted to a decoding portion or the like in a subsequent stage.

It should be noted that in the transmission system 1, the transmission path 30 may be not only for the terrestrial (terrestrial broadcasting), but also for, for example, the satellite broadcasting utilizing a BS (Broadcasting Satellite) or a CS (Communications Satellite), or cable broadcasting (CATV).

In addition, ATSC3.0 is the next-generation broadcasting standards of U.S.A. the development of which is currently promoting. In ATSC3.0, it is supposed that as the transmission system, not MPEG2-TS (Transport Stream) which is currently being spread, but an IP transmission system in which an IP (Internet Protocol) packet used in the field of the communication is used in the digital broadcasting is introduced, thereby providing the more advanced service.

<2. Outline of Frequency Interleave>
(Outline of Frequency Interleave)

Figure 2:
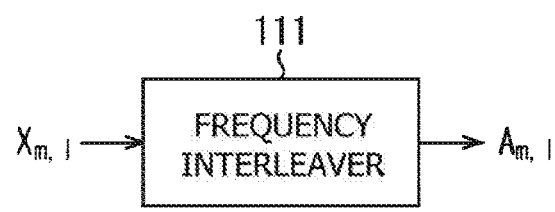
FIG. 2 is a diagram explaining an outline of a frequency interleaver.

Incidentally, in the transmission system 1 of FIG. 1, in order to avoid an influence of a burst error or the like at the time of transmission of the data, on the reception side, frequency interleave for dispersing the transmission data in a frequency direction is carried out. FIG. 2 depicts a frequency interleaver 111 for carrying out the frequency interleave in the processing portion 101 of the transmission apparatus 10.

In the frequency interleaver 111, data (hereinafter referred to as write data $X_{m,l}$ as well) inputted from the circuit in the preceding stage is written to an interleaver memory in accordance with a write address. In addition, data (hereinafter referred to as read data $A_{m,l}$ as well) is read out from the interleaver memory in accordance with a read address. As a result, the frequency interleave is carried out.

Figure 3:
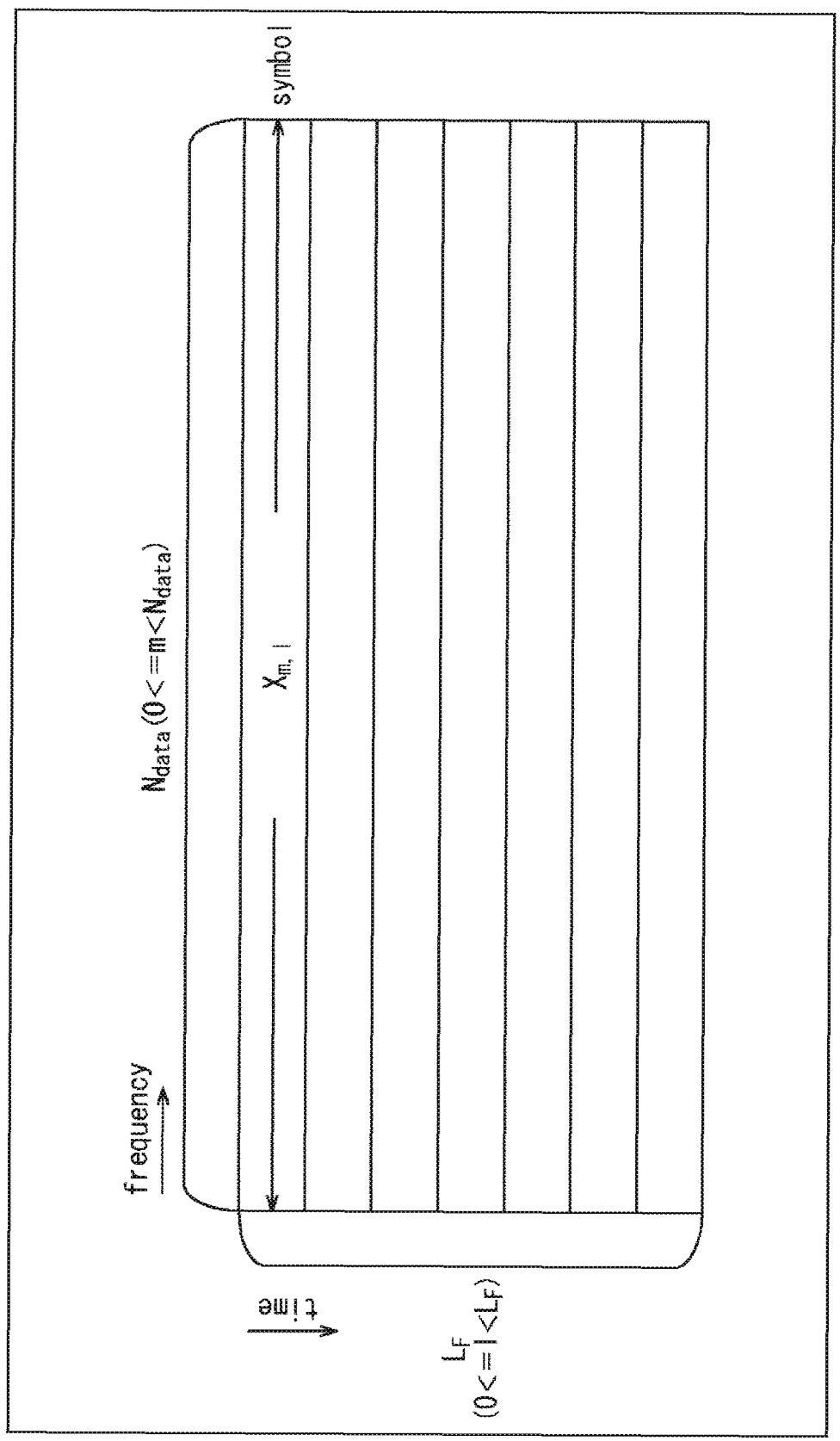
FIG. 3 is a diagram explaining frequency interleave by the frequency interleaver.

FIG. 3 schematically represents the frequency interleave which is carried out by the frequency interleaver 111 of FIG. 2. In FIG. 3, a longitudinal direction represents a time direction, and a transverse direction represents a frequency direction.

In FIG. 3, each of lines in the frequency direction corresponds to data for one symbol. That is, when the write data $X_{m,l}$ is written to the interleaver memory to carry out the frequency interleave, OFDM cells within a sub-frame included in a physical layer frame are discontinuously rearranged (scrambled up) in the frequency direction within one symbol, thereby improving the frequency characteristics.

However, if in FIG. 3, the number of OFDM cells included in one symbol is assigned $N_{data}$, then, m in the write data $X_{m,l}$ meets a relationship of $0 \leq m < N_{data}$. In addition, if the number of symbols within the sub-frame is assigned $L_F$, l in the write data $X_{m,l}$ meets a relationship of $0 \leq l < L_F$.

(Configuration of Frequency Interleaver)

Figure 4:
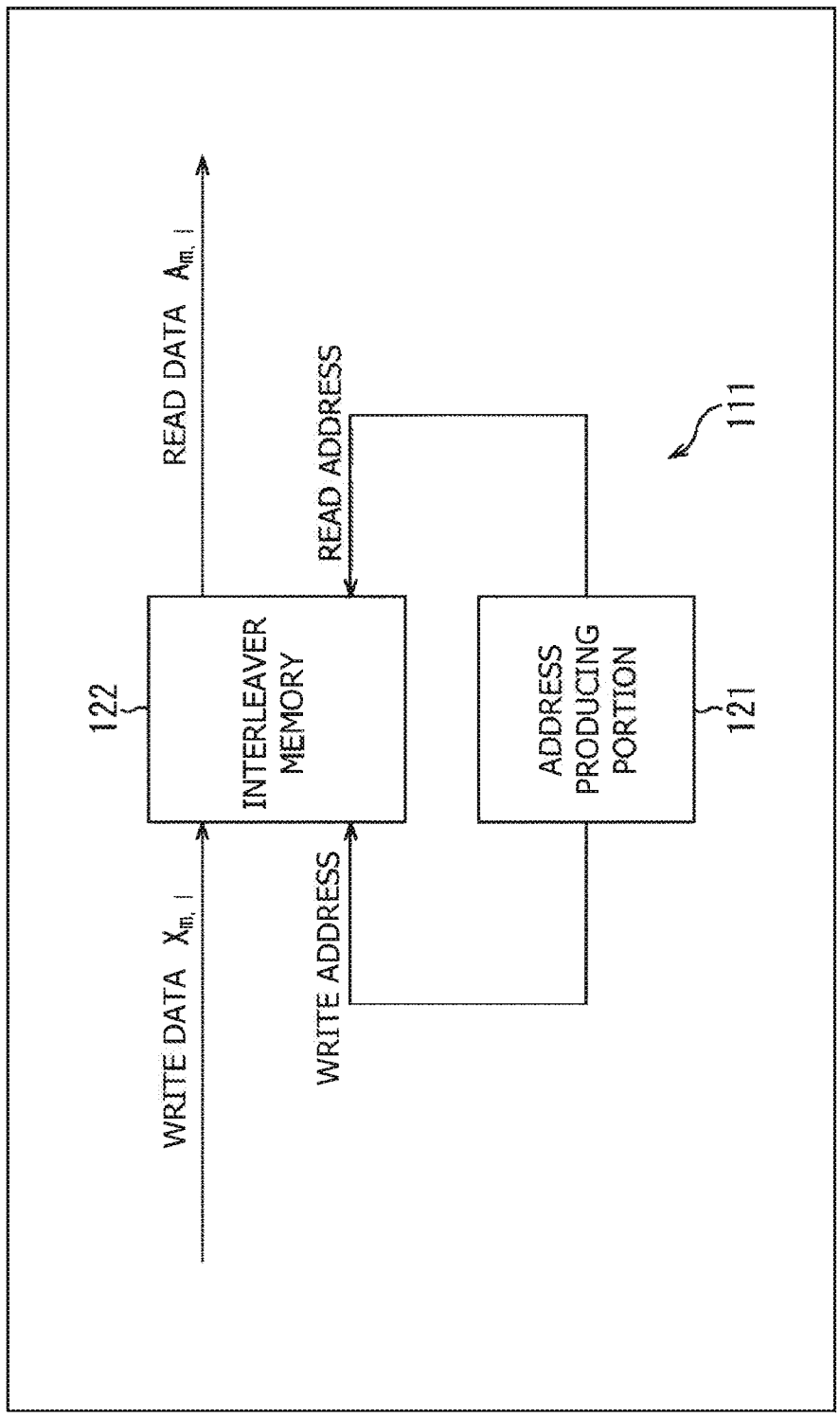
FIG. 4 is a block diagram depicting an example of a configuration of the frequency interleaver.

FIG. 4 is a block diagram depicting an example of a configuration of the frequency interleaver 111 in FIG. 2.

In FIG. 4, the frequency interleaver 111 includes an address producing portion 121 and an interleaver memory 122.

The address producing portion 121 produces a write address in accordance with which the write data $X_{m,l}$ inputted from a circuit in a preceding stage is written to the interleaver memory 122, and supplies the resulting write address to the interleaver memory 122. As a result, the write data $X_{m,l}$ is written to the interleaver memory 122 in accordance with the write address sent from the address producing portion 121.

In addition, the address producing portion 121 produces a read address in accordance with which the data written to the interleaver memory 122 is read out as read data $A_{m,l}$, and supplies the resulting read address to the interleaver memory 122. As a result, the read data $A_{m,l}$ is read out from the interleaver memory 122 in accordance with the read address sent from the address producing portion 121, and is outputted to a circuit in a subsequent stage.

In this way, in the frequency interleaver 111, the address producing portion 121 carries out the address production in such a way that the write address in accordance with which the objective data is written to the interleaver memory 122, and the read address in accordance with which the objective data is read out from the interleaver memory 122 are different from each other. As a result, the interleave in the frequency direction is carried out.

(Configuration of Address Producing Portion)

Figure 5:
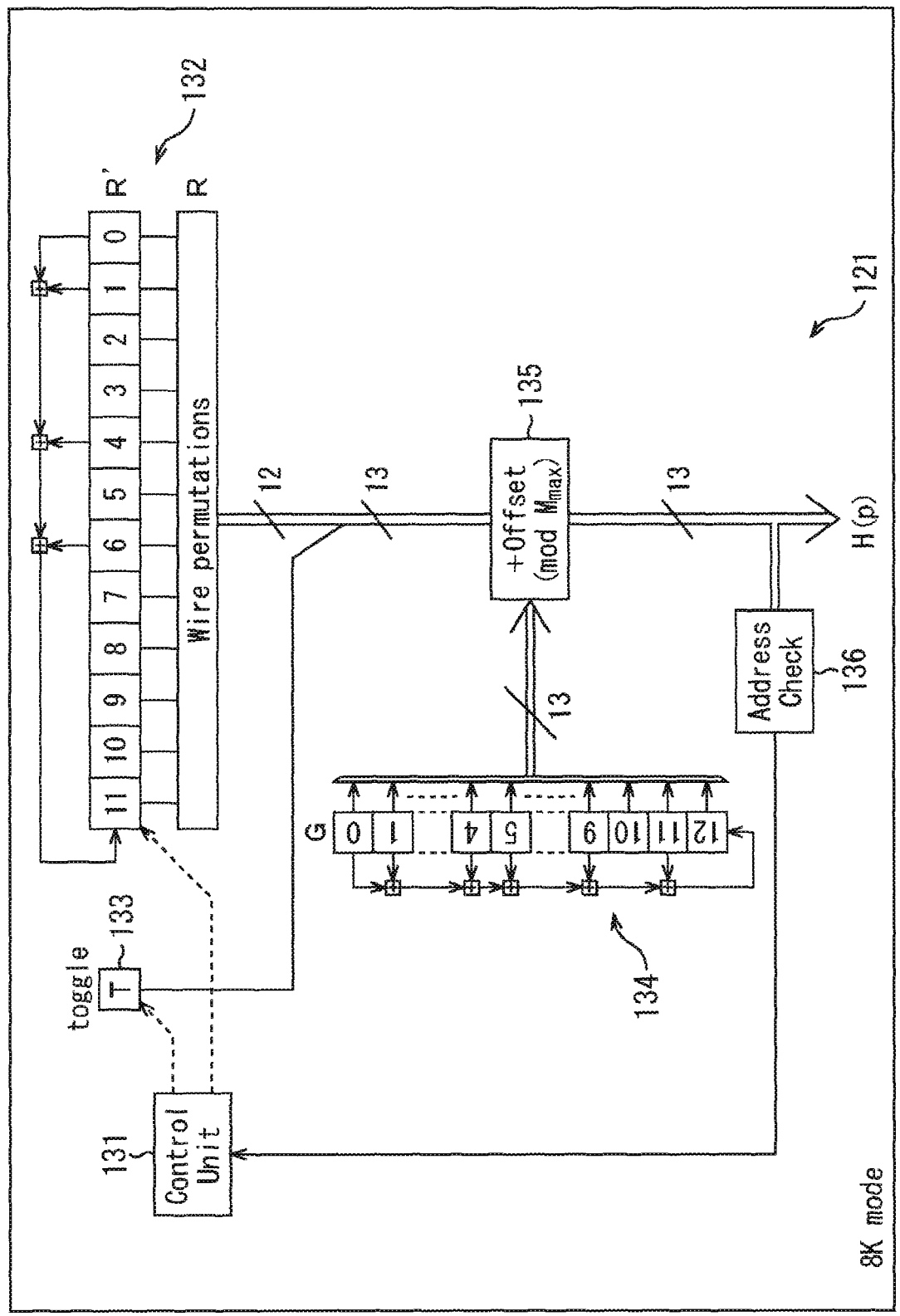
FIG. 5 is a block diagram depicting an example of a configuration of an address producing portion.

FIG. 5 is block diagram depicting an example of a configuration of the address producing portion 121 of FIG. 4.

In FIG. 5, the address producing portion 121 includes a control portion 131, a pseudo random number generating portion 132, a bit producing portion 133, a pseudo random number generating portion 134, an offset calculating portion 135, and an address checking portion 136.

The control portion 131 controls the pseudo random number generating portion 132 and the bit producing portion 133.

The pseudo random number generating portion 132 is a pseudo random number generator for producing a PRBS (Pseudo Random Bit Sequence) including a bit stream of 12 bits in accordance with the control from the control portion 131. In this case, a pseudo random bit sequence (PRBS) having certain cycle and produced from the pseudo random number generating portion 132 is used as a bit stream for an address.

Specifically, the pseudo random number generating portion 132 includes a LFSR (Linear Feedback Shift Register) of 12 bits. In the linear feedback shift register (LFSR), a tap sequence is set as [0, 1, 4, 6]. These taps are successively subjected to exclusive OR (XOR), and the result of the XOR is fed back to the MSB (Most Significant Bit) at the left end. As a result, a bit stream R' of 12 bits is permutated to be converted into a bit stream R of 12 bits.

The bit producing portion 133 alternately produces a bit as 0 and a bit as 1 in accordance with the control from the control portion 131, thereby toggling 1 bit outputted with 0 and 1. This 1 bit is added as the most significant bit (MSB) to the bit stream R for an address of 12 bits outputted from the pseudo random number generating portion 132. Thus, the bit stream for an address is set as a bit stream R of 13 bits.

The pseudo random number generating portion 134 is a pseudo random number generator for producing a pseudo random bit stream (PRBS) including a bit stream of 13 bits. In this case, a pseudo random bit sequence (PRBS) having certain cycle and produced from the pseudo random number generating portion 134 is used as a bit stream for offset.

Specifically, the pseudo random number generating portion 134 includes a LFSR (Linear Feedback Shift Register) of 13 bits. In the linear feedback shift register (LFSR), a tap sequence is set as [0, 1, 4, 5, 9, 11]. These taps are successively subjected to the exclusive OR (XOR), and the result of the XOR is fed back to the most significant bit (MSB) at the lower end. As a result, a bit stream G of 13 bits is outputted. However, this bit stream G (bit stream for offset) is updated every two symbols.

A bit stream R of 13 bits which is obtained by adding the most significant bit of 1 bit and the bit stream G of 13 bits from the pseudo random number generating portion 134 are inputted to the bit stream R of 12 bits from the pseudo random number generating portion 132 in the offset calculating portion 135. The offset calculating portion 135 adds the bit stream G for offset of 13 bits to the bit stream R for an address of 13 bits, and outputs the resulting bit stream of 13 bits as the bit stream for an address.

That is, in this case, adding the sequence of the bit stream R for an address, and the sequence of the bit stream G for offset to each other, thereby enabling the more complicated address to be produced. However, the bit stream R for an address is produced every OFDM cell within one symbol, whereas the bit stream G for offset is updated (produced) every two symbols.

The address checking portion 136 checks whether or not the bit stream for an address of 13 bits outputted from the offset calculating portion 135 falls within a data length. In this case, the check of the address is carried out depending on whether or not a relationship of address $H(p)<N_{data}$ is met.

In a case where the bit stream for an address of 13 bits falls within the data length, the address checking portion 136 determines that the produced bit stream for an address is valid. As a result, the address H(p) concerned is supplied as the write address or the read address from the address producing portion 121 to the interleaver memory 122.

On the other hand, in a case where the bit stream R for an address of 13 bits does not fall within the data length, the address checking portion 136 determines that the produced bit stream for an address is invalid. In this case, the address checking portion 136 supplies the result of the address check to the control portion 131. Then, the control portion 131 controls the pseudo random number generating portion 132, the bit producing portion 133 and the like on the basis of the result of the address check inputted thereto, thereby regenerating the bit stream R for an address.

It should be noted that although the transmission system 1 of FIG. 1 can response to a plurality of FFT modes (8K, 16K, 32K) so as to comply with the standards, for the digital broadcasting, such as ATSC3.0, the address producing portion 121 of FIG. 5 exemplifies a configuration in a case where an 8K mode is mounted as the FFT mode.

<Production of Bit Stream $R_i$ for Address>

Here, a description will now be given with respect to the detailed contents of the production of the bit stream $R_i$ for an address in the pseudo random number generating portion 132 of FIG. 5 with reference to FIG. 6 to FIG. 10.

As depicted in FIG. 6, in a case where i=0, 1, and i=2, the bit stream $R'_i$ has the following relationship. However, i represents an index of an address.

$$i=0,1:R'_i[N_r-2, N_r-3, \ldots, 1, 0]=[0, 0, \ldots, 0, 0]$$

$$i=2:R'_i[N_r-2, N_r-3, \ldots, 1, 0]=[0, 0, \ldots, 0, 1]$$

In addition, in a case where $2<i<M_{max}$, the bit stream $R'_i$ has the following relationship.

$$2<i<M_{max}:R'_i[N_r-3, N_r-4, \ldots, 1, 0]=R'_{i-1}[N_r-2, N_r-3, \ldots, 2, 1]$$

Figure 7:
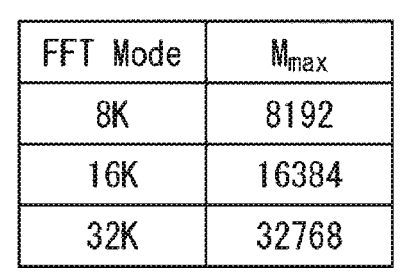

However, a value of $M_{max}$ is changed in response to the FFT mode, and a value of $N_r$ is obtained by calculating $\log_2 M_{max}$. For example, as depicted in FIG. 7, in a case where the FFT mode is an 8K mode (FFT size is 8K), $M_{max}=8192$ is obtained. Therefore, $N_r=\log_2 8192=13$. In addition, in a case where the FFT mode is a 16K mode (FFT size is 16K), $M_{max}=16384$ is obtained. Therefore, $N_r=\log_2 16384=14$. Moreover, in a case where the FFT mode is a 32K mode (FFT size is 32K), $M_{max}=32768$ is obtained. Therefore, $N_r=\log_2 32768=15$.

That is, as depicted in FIG. 5, in the 8K mode, in (the linear feedback shift register (LFSR) of) the pseudo random number generating portion 132, the tap sequence is set as [0, 1, 4, 6]. These taps are successively subjected to the exclusive OR (XOR), and the result of the XOR is fed back to the most significant bit (MSB) at the left end. For this reason, as depicted in FIG. 6, the 8K mode has a relationship of $R'_i[11]=R'_{i-1}[0]$ XOR $R'_{i-1}[1]$ XOR $R'_{i-1}[4]$ XOR $R'_{i-1}[6]$.

FIG. 8 depicts an example of conversion from the bit stream $R'_i$ to the bit stream $R_i$ in the 8K mode. However, in FIG. 8, the numerical numbers of 0 to 11 represent bit positions between the LSB (Least Significant Bit) and the most significant bit (MSB) in each of the bit streams.

When in a case where the FFT mode becomes the 8K mode, and it becomes a symbol of an even number (even), the bit stream $R'_i$ of 12 bits [11, 10, 9, 8, 7, 6, 5, 4, 3, 2, 1, 0] is converted into the bit stream $R_i$ of 12 bits [5, 11, 3, 0, 10, 8, 6, 9, 2, 4, 1, 7]. In addition, when in a case where the FFT mode becomes the 8K mode, and it becomes a symbol of an odd number (odd), the bit stream $R'_i$ of 12 bits [11, 10, 9, 8, 7, 6, 5, 4, 3, 2, 1, 0] is converted into the bit stream $R_i$ of 12 bits [8, 10, 7, 6, 0, 5, 2, 1, 3, 9, 4, 11].

Referring back to the description of FIG. 6, although not illustrated, in a case where the FFT mode is the 16K mode, the tap sequence of the linear feedback shift register (LFSR) is set as [0, 1, 4, 5, 9, 11]. These tap sequences are successively subjected to the exclusive OR (XOR), and the result of the XOR is fed back to the most significant bit (MSB) at the left end.

For this reason, as depicted in FIG. 6, the 16K mode has a relationship of $R'_i[12]=R'_{i-1}[0]$ XOR $R'_{i-1}[1]$ XOR $R'_{i-1}[4]$ XOR $R'_{i-1}[5]$ XOR $R'_{i-1}[9]$ XOR $R'_{i-1}[11]$. It should be noted that the configuration of the linear feedback shift register (LFSR) in the 16K mode is disclosed in "Figure 7.27 FI address generation scheme for the 16K mode" of NPL 1 described above.

FIG. 9 depicts an example of conversion from the bit stream $R'_i$ to the bit stream $R_i$ in the 16K mode. However, in FIG. 9, the numerical numbers of 0 to 12 represent the bit positions in each of the bit streams.

When in a case where the FFT mode is the 16K mode, and it becomes a symbol of an even number, the bit stream $R'_i$ of 13 bits [12, 11, 10, 9, 8, 7, 6, 5, 4, 3, 2, 1, 0] is converted into the bit stream $R_i$ of 13 bits [8, 4, 3, 2, 0, 11, 1, 5, 12, 10, 6, 7, 9]. In addition, when in a case where the FFT mode is the 16K mode, and it becomes a symbol of an odd number (odd), the bit stream $R'_i$ of 13 bits [12, 11, 10, 9, 8, 7, 6, 5, 4, 3, 2, 1, 0] is converted into the bit stream $R_i$ of 13 bits [7, 9, 5, 3, 11, 1, 4, 0, 2, 12, 10, 8, 6].

Referring back to the description of FIG. 6, although not illustrated, in a case where the FFT mode is the 32K mode, the tap sequence of the linear feedback shift register (LFSR)

is set as [0, 1, 2, 12]. These tap sequences are successively subjected to the exclusive OR (XOR), and the result of the XOR is fed back to the most significant bit (MSB) at the left end.

For this reason, as depicted in FIG. 6, the 32K modes have a relationship of $R'_i[13]=R'_{i-1}[0]$ XOR $R'_{i-1}[1]$ XOR $R'_{i-1}[2]$ XOR $R'_{i-1}[12]$. It should be noted that the configuration of the linear feedback shift register (LFSR) in the 32K mode is disclosed in "Figure 7.28 FI address generation scheme for the 32K mode" of NPL 1 described above.

FIG. 10 depicts an example of conversion from the bit stream $R'_i$ to the bit stream $R_i$ in the 32K mode. However, in FIG. 10, the numerical numbers of 0 to 13 represent the bit positions in each of the bit streams.

In a case where the FFT mode becomes the 32K mode, the bit stream $R'_i$ of 14 bits [13, 12, 11, 10, 9, 8, 7, 6, 5, 4, 3, 2, 1, 0] is converted into the bit stream $R_i$ of 14 bits [6, 5, 0, 10, 8, 1, 11, 12, 2, 9, 4, 3, 13, 7].

(Production of Bit Stream $G_k$ for Offset)

Next, a description will now be given with respect to detailed contents of production of a bit stream $G_k$ for offset in the pseudo random number generating portion 134 of FIG. 5 with reference to FIG. 11.

As depicted in FIG. 11, in a case where k=0, the bit stream $G_k$ has the following relationship. However, k represents an index of the offset updated every two symbols.

$$k=0: G_k[N_r-1, N_r-2, \ldots, 1, 0]=[1, 1, \ldots, 1, 1]$$

In addition, in a case where $0<k<L_F/2$, the bit stream $G_k$ has the following relationship.

$$0<k<L_F/2: G_k[N_r-2, N_r-3, \ldots, 1, 0]=G_{k-1}[N_r-1, N_r-2, \ldots, 2, 1]$$

That is, as depicted in FIG. 5, in a case where the FFT mode is the 8K mode, in (the linear feedback shift register (LFSR) of) the pseudo random number generating portion 134, the tap sequence is set as [0, 1, 4, 5, 9, 11]. These taps are successively subjected to the exclusive OR (XOR), and the result of the XOR is fed back to the most significant bit (MSB) at the lower end. For this reason, as depicted in FIG. 11, the 8K mode has a relationship of $G_k[12]=G_{k-1}[0]$ XOR $G_{k-1}[1]$ XOR $G_{k-1}[4]$ XOR $G_{k-1}[5]$ XOR $G_{k-1}[9]$ XOR $G_{k-1}[11]$.

In addition, although not illustrated, in a case where the FFT mode is the 16K mode, the tap sequence of the linear feedback shift register (LFSR) is set as [0, 1, 2, 12]. These taps are successively subjected to the exclusive OR (XOR), and the result of the XOR is fed back to the most significant bit (MSB) at the lower end. For this reason, as depicted in FIG. 11, the 16K mode has a relationship of $G_k[13]=G_{k-1}[0]$ XOR $G_{k-1}[1]$ XOR $G_{k-1}[2]$ XOR $G_{k-1}[12]$. It should be noted that the configuration of the linear feedback shift register (LFSR) in the 16K mode is disclosed in "Figure 7.27 FI address generation scheme for the 16K mode" of NPL 1 described above.

Moreover, although not illustrated, in a case where the FFT mode is the 32K mode, the tag sequence of the linear feedback shift register (LFSR) is set as [0, 1]. These taps are successively subjected to the exclusive OR (XOR), and the result of the XOR is fed back to the most significant bit (MSB) at the lower end. For this reason, as depicted in FIG. 11, the 32K mode has a relationship of $G_k[14]=G_{k-1}[0]$ XOR $G_{k-1}[1]$. It should be noted that the configuration of the linear feedback shift register (LFSR) in the 32K mode is disclosed in "Figure 7.28 FI address generation scheme for the 32K mode" of NPL 1 described above.

<3. Address Production Expression of Frequency Interleave>

(Address Production Expression Before Correction)

FIG. 12 is a view depicting an address production expression of a write address or a read address which is produced by the address producing portion 121 of FIG. 5.

As depicted in FIG. 12, in the address producing portion 121 of FIG. 5, in $0 \le i < M_{max}$, an address $H_l(p)$ is produced by following Expression (1).

[Math. 1]

$$H_l(p)=[(i \bmod 2)2^{N_r-1}+\sum_{j=0}^{N_r-2} R_i[j]2^j+\sum_{j=0}^{N_r-1} G_{[l/2]}[j]2^j] \bmod M_{max} \quad (1)$$

However, in [ ] of a right side of Expression (1), a first term corresponds to 1 bit produced by the bit producing portion 133 (FIG. 5), and i mod 2 represents the rest when i is divided by 2. In addition, a second term corresponds to the bit stream $R_i$ for an address produced by the pseudo random number generating portion 132 (FIG. 5). A third term corresponds to the bit stream $G_k$ for offset produced by the pseudo random number generating portion 134 (FIG. 5).

In addition, in Expression (1), l of the left side represents a number of a symbol within a sub-frame included in a physical layer frame, and p of the left side represents a number of a cell within a symbol. In addition, i of the right side represents an index of an address, and $N_r$ and $M_{max}$ of the right side become values determined depending on the FFT mode. That is, in a case where the FFT mode becomes the 8K mode, $N_r=13$, and $M_{max}=8192$ are individually set. In addition, in a case where the FFT mode is the 16K mode, $N_r=14$, and $M_{max}=16384$ are individually set, and in a case where the FFT mode becomes the 32K mode, $N_r=15$, and $M_{max}=32768$ are set.

Then, in the address producing portion 121 of FIG. 5, the address checking portion 136 checks whether or not the address $H_l(p)$ obtained from Expression (1) falls within a data length ($N_{data}$). In a case where it is checked that the address $H_l(p)$ falls within the data length ($N_{data}$), that is, $H_l(p)<N_{data}$ is established, the address $H_l(p)$ concerned is determined to be valid, and is used as the write address or the read address.

On the other hand, in a case where it is checked that the address $H_l(p)$ does not fall within the data length ($N_{data}$), that is, $H_l(p) \ge N_{data}$ is established, the address $H_l(p)$ concerned is determined to be invalid. In this case, the address $H_l(p)$ will be regenerated from Expression (1) described above.

(Concrete Example of Address Production)

Next, a concrete example of an address obtained from the address production expression (Expression (1)) of FIG. 12 will be exemplified with reference to FIG. 13.

In the concrete example of FIG. 13, there is depicted a value of the address $H_l(p)$ when in a case where $R_i=3000$ and $R_{i+1}=100$ are produced in order as the bit stream R for an address produced by the pseudo random number generating portion 132 (FIG. 5), the bit stream G for offset produced by the pseudo random number generating portion 134 (FIG. 5) is assumed to become $G_k=2000$.

$$R_i: H_l(p)=0+R_i+G_k=0+3000+2000=5000 (\bmod 8192)$$

$$R_{i+1}: H_l(p)=4096+R_{i+1}+G_k=4096+100+2000=6196 (\bmod 8192)$$

It should be noted that although the values for production of the address $H_l(p)$ are expressed in the form of the decimal digit, when for facilitating understanding of the description, these values are expressed in the term of binary digit instead of the decimal digit, they are decided as follows.

0→0000000000000
3000→101110111000
2000→11111010000
5000→1001110001000
4096→1000000000000
100→1100100
2000→11111010000
6196→1100000110100

However, in the concrete example of FIG. 13, the case where the FFT mode is the 8K mode is exemplified. Therefore, the address $H_l(p)$ produced is 13 bits. In addition, i represents an even number, and in a case where i is the even number, the bit as 0 is added as the most significant bit of the bit stream $R_i$ of 12 bits. In addition, i+1 represents an odd number, and in a case where i is the odd number, the bit as 1 is added as the most significant bit of the bit stream $R_{i+1}$ of 12 bits.

In addition, since the bit stream $G_k$ is updated every two symbols, in this example, $G_k$ shall be fixed to 2000 ($G_k$=2000). Moreover, since in this example, it is premised that in a case where the FFT mode is the 8K mode, $N_{data}$ is larger than $M_{max}/2$=8192/2=4096, $N_{data}$=4500 is assumed.

In a case where the address $H_l(p)$ is produced in such a way by using $R_i$ and Ri+1 from the address production expression (Expression (1)) of FIG. 12, both 5000 and 6196 which are continuously produced exceed $N_{data}$=4500. Therefore, the valid address $H_l(p)$ cannot be produced twice in a row, and the regeneration of the address $H_l(p)$ needs to be repeatedly carried out.

In a case where the address production expression of FIG. 12 (Expression (1): address production expression before correction) is applied as described above, when the valid address $H_l(p)$ is produced is not guaranteed, and the mounting of the hardware (HW) cannot be efficiently carried out. Therefore, in the address production carried out by the address producing portion 121, the proposal for more reliably producing the valid address has been requested. Then, hereinafter, a description will be given with respect to an address production expression (Expression (2) to Expression (4): an address production expression after correction) with which the valid address can be more reliably produced.

(Address Production Expression after Correction)

FIG. 14 is a view depicting an example of an address production expression after correction which is obtained by correcting the address production expression of FIG. 12.

As depicted in FIG. 14, in the address production expression after correction, the address $H_l(p)$ is produced from following Expression (2).

[Math. 2]

$$H_l(p)=[(i \bmod 2)2^{N_r-1}+\Sigma_{j=0}^{N_r-2}R_i[j]2^j]\oplus\Sigma_{j=0}^{N_r-1}G_{[l/2]}[j]2^j \quad (2)$$

However, in a right side of Expression (2), a first term in [ ] corresponds to 1 bit produced by the bit producing portion 133, and i mod 2 represents the rest when i is divided by 2. In addition, a second term in [ ] corresponds to the bit stream $R_i$ produced by the pseudo random number generating portion 132. A third term described outside [ ] corresponds to the bit stream $G_k$ produced by the pseudo random number generating portion 134.

In addition, in Expression (2), 1 of the left side represents a number of a symbol within a sub-frame included in the physical layer frame, and p of the left side represents a number of a cell within a symbol. In addition, i of the right side represents an index of an address, and $N_r$ of the right side becomes a value determined depending on the FFT mode. That is, in a case where the FFT mode becomes the 8K mode, $N_r$=13 is set. In addition, in a case where the FFT mode becomes the 16K mode, $N_r$=14 is set, and in a case where the FFT mode becomes the 32K mode, $N_r$=15 is set.

Here, comparing the address production expression after correction (Expression (2)) with the address production expression before correction (Expression (1)) described above, although the former and the latter agree with each other in that the first term and the second term of the right side are added to each other, the former and the latter are different from each other in treatment of the third term of the right side. That is, although in Expression (1) described above, the third term is added as the offset, in Expression (2), the exclusive OR (XOR) is obtained from the third term.

(Concrete Example of Address Production)

Next, a concrete example of the address obtained from the address production expression (Expression (2)) of FIG. 14 will be exemplified with reference to FIG. 15.

In the concrete example of FIG. 15, similarly to the case of the concrete example of FIG. 13, there is depicted a value of the address $H_l(p)$ when in a case where as the bit stream R produced by the pseudo random number generating portion 132, $R_i$=3000 and $R_{i+1}$=100 are produced in order, the bit stream G produced by the pseudo random number generating portion 134 is assumed to become $G_k$=2000.

$R_i:H_l(p)=(0+R_i)\text{XOR}G_k=(0+3000)\text{XOR}2000=3000\text{XOR}2000=3176$ $R_{i+1}:H_l(p)=(4096+R_{i+1})\text{XOR}G_k=(4096+100)\text{XOR}2000=4196\text{XOR}2000=6068$ It should be noted that although the values for production of the address $H_l(p)$ are expressed in the form of decimal digit, when for facilitating understanding of the description, these values are expressed in the term of binary digit instead of the decimal digit as follows.

0→0000000000000
3000→101110111000
2000→11111010000
3176→110001101000
4096→1000000000000
100→1100100
4196→1000001100100
2000→11111010000
6068→1011110110100

However, the condition of assumption in the concrete example of FIG. 15 is similar to that in the concrete example of FIG. 13. Thus, in this example as well, $N_{data}$=4500 is assumed. In this case, for example, in a case where the FFT mode is the 8K mode, it is premised that $N_{data}$ is larger than $M_{max}/2$=8192/2=4096. Therefore, $N_{data}$=4500 is set.

In a case where although the address $H_l(p)$ is produced in such a way by using $R_i$ and $R_{i+1}$ from the address production expression of FIG. 14 (Expression (2)), one or 6068 of 3176 and 6068 which are continuously produced is larger than 4500 (=$N_{data}$), the other or 3176 is smaller than 4500 (=$N_{data}$). In this case, 3176 can be made the valid address $H_l(p)$.

That is, in a case where the address production expression of FIG. 14 (Expression (2): address production expression after correction) is applied, the valid address $H_l(p)$ is produced at least once a twice. Therefore, in a case where the valid address $H_l(p)$ is produced, it can be used. Even if the valid address $H_l(p)$ is not produced, and thus the regeneration of the valid address $H_l(p)$ is carried out, the address $H_i(p)$ which is produced next time becomes necessarily the valid address $H_i(p)$. For this reason, it is guaranteed that the valid address $H_i(p)$ is produced once a twice, and thus the valid address can be more reliably produced.

The reason for this is as follows: in the address production expression of FIG. 14 (Expression (2)), after the first term and the second term of the right side are added to each other, the exclusive OR (XOR) is obtained from the third term. Therefore, if the exclusive OR (XOR) for the most significant bit in which 0 and 1 are toggled, then, the calculated value of the most significant bit necessarily becomes 0 once a twice. Therefore, it is guaranteed that when the bit becomes 0, the address $H_i(p)$ becomes necessarily smaller than $N_{data}$.

Here, in DVB-T2 (Digital Video Broadcasting-Second Generation Terrestrial), in the address production of the frequency interleaver, it was not carried out that the third term of the right side was added as the offset like Expression (1) described above, but the first term and the second term of the right side were added to each other, thereby carrying out the address production. In this case, there is a limitation in which the size of the OFDM cell (cell) in one symbol is equal to or larger than $M_{max}/2$. Therefore, with respect to 1 bit address added as the most significant bit, 0 and 1 are toggled, so that the most significant bit becomes necessarily 0 once a twice. For this reason, when the bit in the toggle becomes 0, the value of the address $H_i(p)$ becomes smaller than $N_{data}$. Thus, it was guaranteed that the valid address $H_i(p)$ is produced once a twice.

Then, in the address producing portion 121 of the frequency interleaver 111, it is possible to guarantee that by applying the address production expression (Expression (2)) of FIG. 14, similarly to the case f DVB-T2, the valid address $H_i(p)$ is necessarily produced once a twice. For example, unless it is guaranteed that the valid address $H_i(p)$ is produced once a twice, it is supposed that the valid address cannot be produced ten times in a row, and so forth. As a result, the hardware (HW) becomes difficult to mount. On the other hand, as long as it is guaranteed that the valid address $H_i(p)$ is produced once a twice, for example, two address producing portions 121 are provided, so that one address producing portion 121 can necessarily produce the valid address $H_i(p)$. Therefore, such mounting also becomes possible.

(Configuration of Address Producing Portion)

Figure 16:
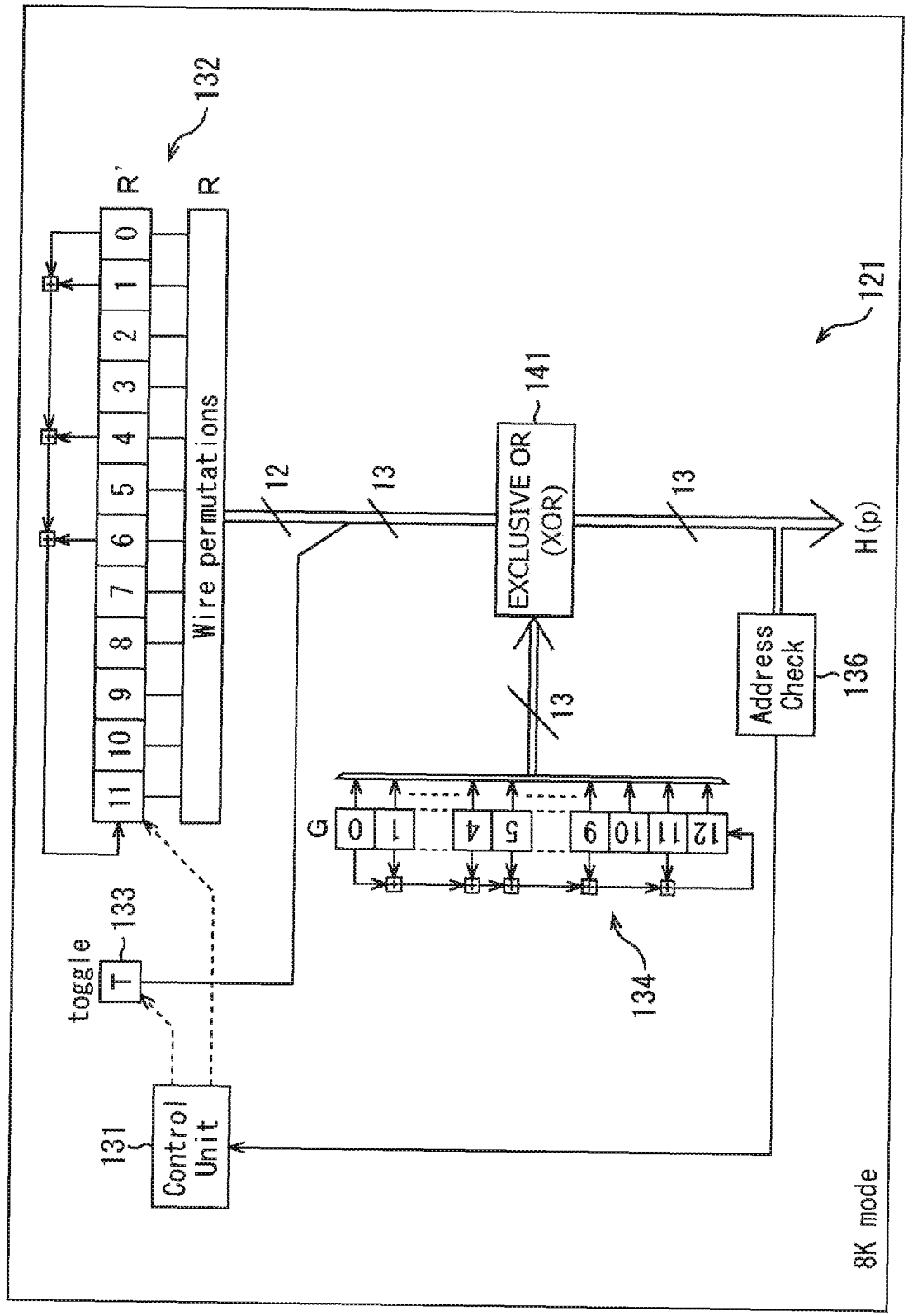
FIG. 16 is a block diagram depicting an example of a configuration of an address producing portion corresponding to the address production expression after the correction.

FIG. 16 is a block diagram depicting an example of a configuration of the address producing portion 121 corresponding to the address production expression (Expression (2)) after the correction. However, in the address producing portion 121 as well of FIG. 16, the configuration in a case where the 8K mode is mounted as the FFT mode is exemplified.

As compared with the case of the address producing portion 121 of FIG. 5, the address producing portion 121 of FIG. 16 is provided with an exclusive OR calculating portion 141 instead of the offset calculating portion 135. However, in the address producing portion 121 of FIG. 16, portions corresponding to those of the address producing portion 121 of FIG. 5 are assigned the same reference numerals, and a description there of is suitably omitted herein.

The pseudo random number generating portion 132 produces the pseudo random bit series (PRBS) having a certain cycle and including the bit stream of 12 bits in accordance with the control from the control portion 131, and outputs the resulting pseudo random bit series.

Specifically, the pseudo random number generating portion 132 includes a Linear Feedback Shift register (LFSR) of 12 bits. In the linear feedback shift register (LFSR), a tap sequence is set as [0, 1, 4, 6]. These taps are successively subjected to the exclusive OR (XOR), and the result of the XOR is fed back to the most significant bit (MSB) at the left end. As a result, a bit stream R' of 12 bits is converted into a bit stream R of 12 bits.

The bit producing portion 133 alternately produces a bit as 0 and a bit as 1 in accordance with the control from the control portion 131, thereby toggling 1 bit outputted with 0 and 1. This 1 bit is added as the most significant bit (MSB) to the bit stream R for an address of 12 bits outputted from the pseudo random number generating portion 132. Thus, the bit stream for an address is set as a bit stream R of 13 bits.

The pseudo random number generating portion 134 produces a bit stream (PRBS) having a certain cycle and including a bit stream of 13 bits, and the outputs the resulting pseudo random bit series (PRBS).

Specifically, the pseudo random number generating portion 134 includes a linear feedback shift register (LFSR) of 13 bits. In the linear feedback shift register (LFSR), a tap sequence is set as [0, 1, 4, 5, 9, 11]. These taps are successively subjected to the exclusive OR (XOR), and the result of the XOR is fed back to the most significant bit (MSB) at the lower end. As a result, a bit stream G of 13 bits is outputted. However, this bit stream G is updated every two symbols.

The bit stream R of 13 bits which is obtained by adding the most significant bit of 1 bit to the bit stream R of 12 bits from the pseudo random number generating portion 132, and the bit stream G of 13 bits from the pseudo random number generating portion 134 are inputted to the exclusive OR calculating portion 141. The exclusive OR calculating portion 141 obtains the exclusive OR (XOR) between the bit stream R of 13 bits and the bit stream G of 13 bits, and outputs the resulting bit stream of 13 bits as the bit stream for an address.

The address checking portion 136 checks whether or not the bit stream for an address of 13 bits outputted from the exclusive OR calculating portion 141 falls within a data length. The address $H_i(p)$ which is determined to be valid by the address checking portion 136 is supplied as the write address or the read address to the interleaver memory 122. On the other hand, in a case where the bit stream for an address is determined to be invalid, the bit stream for an address shall be regenerated.

The address producing portion 121 corresponding to the address production expression after correction (Expression (2)) is configured in the manner as described above.

(Other Address Production Expressions after Correction)

The address production expression of FIG. 14 (Expression (2)) described above is an example of the address production expression after correction. As long as an address production expression is one which can guarantee that the valid address $H_i(p)$ is necessarily produced once a twice, other address production expressions may be adopted. FIG. 17 is a view depicting an example of other address production expressions after correction.

As depicted in A of FIG. 17, the address $H_i(p)$ may be produced as the address production expression after correction from following Expression (3).

[Math. 3]

$$H_i(p) = (i \bmod 2)2^{N_r-1} + [\Sigma_{j=0}^{N_r-2} R_i[j]2^j + \Sigma_{j=0}^{N_r-2} G_{[i/2]}[j]2^j] (\bmod M_{max}/2) \quad (3)$$

However, in a right side of Expression (3), a first term corresponds to 1 bit produced by the bit producing portion 133, and i mod 2 represents the rest when i is divided by 2. In addition, a second term of the right side corresponds to the bit stream $R_I$ produced by the pseudo random number generating portion 132. A third term corresponds to the bit stream $G_k$ produced by the pseudo random number generating portion 134.

In addition, in Expression (3), l of the left side represents a number of a symbol within a sub-frame included in the physical layer frame, and p of the left side represents a number of a cell within a symbol. In addition, i of the right side represents an index of an address, and $N_r$ and $M_{max}$ of the right side become values determined depending on the FFT mode. That is, in a case where the FFT mode becomes the 8K mode, $N_r=13$, $M_{max}=8192$ are individually set. In addition, in a case where the FFT mode is the 16K mode, $N_r=14$, $M_{max}=16384$ are individually set and in a case where the FFT mode is the 32K mode, $N_r=15$, $M_{max}=32768$ are individually set.

Here, comparing the address production expression after correction (Expression (3)) with the address production expression before correction described above (Expression (1)), the former and the latter are different from each other in that in the third term of the right side, the number of bits of the bit stream Gk is reduced from $N_{r-1}$ bits to $N_{r-2}$ bits by 1 bit, and has the same number of bits as the number of bits of the bit stream $R_i$. Then, after the bit stream $R_i$ and the bit stream $G_k$ which have the same number of bits are added to each other, the bit as 0 or 1 is added to the resulting most significant bit (MSB).

For example, in a case where the FFT mode is the 8K mode, in (the linear feedback shift register (LFSR) of) the pseudo random number generating portion 132, the bit stream $R_i$ of 12 bits is produced, whereas in (the linear feedback shift register (LFSR) of) the pseudo random number generating portion 134 as well, the bit stream $G_k$ of 12 bits is produced. Then, the bit as 0 or 1 from the bit producing portion 133 is added to the most significant bit (MSB) which is obtained by adding the bit stream $R_i$ of 12 bits and the bit stream $G_k$ of 12 bits to each other. The resulting bit stream of 13 bits is set as the address $H_l(p)$.

In addition, for example, in a case where the FFT mode is the 16K mode, the bit stream $R_i$ of 13 bits and the bit stream $G_k$ of 13 bits are produced, and the bit as 0 or 1 is added to the most significant bit (MSB) which is obtained by adding the bit stream $R_i$ of 13 bits and the bit stream $G_k$ of 13 bits to each other. The resulting bit stream of 14 bits is set as the address $H_l(p)$. Moreover, for example, in a case where the FFT mode is the 32K mode, the bit stream $R_i$ of 14 bits and the bit stream $G_k$ of 14 bits are produced, and the bit as 0 or 1 is added to the most significant bit (MSB) which is obtained by adding the bit stream $R_i$ of 14 bits and the bit stream $G_k$ of 14 bits to each other. The resulting bit stream of 15 bits is set as the address $H_l(p)$.

In a case where the address production expression (Expression (3)) of FIG. 17 is applied in such a manner, after the second term and the third term of the right side are added to each other, the bit as 0 or 1 is added as the most significant bit (MSB) thereof. Therefore, in the most significant bit (MSB), 0 and 1 are toggled, and 0 is necessarily obtained once a twice. For this reason, it is guaranteed that in the address producing portion 121, the valid address $H_l(p)$ is produced once a twice. As a result, the valid address can be more reliably produced.

In addition, as depicted in B of FIG. 17, the address $H_l(p)$ may be produced by following Expression (4) in terms of the address production expression after correction.

[Math. 4]

$$H_l(p) = (i \bmod 2)2^{N_r-1} + [\Sigma_{j=0}^{N_r-2} R_i[j]2^j \oplus \Sigma_{j=0}^{N_r-2} 2G_{[l/2][j]}2^j] \quad (4)$$

However, in a right side of Expression (4), a first term corresponds to 1 bit produced by the bit producing portion 133, and i mod 2 represents the rest when i is divided by 2. In addition, a second term corresponds to the bit stream $R_i$ produced by the pseudo random number generating portion 132. A third term corresponds to the bit stream $G_k$ produced by the pseudo random number generating portion 134.

In addition, in Expression (4), l of the left side represents a number of a symbol within a sub-frame included in the physical layer frame, and p of the left side represents a number of a cell within a symbol. In addition, i of the right side represents an index of an address, and $N_r$ of the right side becomes a value determined depending on the FFT mode. That is, in a case where the FFT mode becomes the 8K mode, $N_r=13$ is set. In addition, in a case where the FFT mode becomes the 16K mode, $N_r=14$ is set, and in a case where the FFT mode becomes the 32K mode, $N_r=15$ is set.

Here, comparing the address production expression after correction (Expression (4)) with the address production expression after correction (Expression (3)), the former and the latter are different from each other in that the bit stream $R_i$ and the bit stream $G_k$ which have the same number of bits are not added to each other, but the exclusive OR (XOR) between the bit stream $R_i$ and the bit stream $G_k$ which have the same number of bits is obtained. In addition, in the address production expression after correction (Expression (4)), it is similar to that in the case of the address production expression after correction (Expression (3)) described above that the bit as 0 or 1 is added to the most significant bit (MSB) of the bit stream obtained from the exclusive OR (XOR).

For example, in a case where the FFT mode is the 8K mode, in (the linear feedback shift register (LFSR) of) the pseudo random number generating portion 132, the bit stream $R_i$ of 12 bits is produced, whereas in (the linear feedback shift register (LFSR) of) the pseudo random number generating portion 134 as well, the bit stream $G_k$ of 12 bits is produced. Then, the bit as 0 or 1 from the bit producing portion 133 is added to the most significant bit (MSB) which is obtained from the exclusive OR (XOR) between the bit stream $R_i$ of 12 bits and the bit stream $G_k$ of 12 bits. The resulting bit stream of 13 bits is set as the address $H_l(p)$.

In addition, for example, in a case where the FFT mode is the 16K mode, the bit stream $R_i$ of 13 bits and the bit stream $G_k$ of 13 bits are produced, and the bit as 0 or 1 is added to the most significant bit (MSB) which is obtained from the exclusive OR (XOR) between the bit stream $R_i$ of 13 bits and the bit stream $G_k$ of 13 bits. The resulting bit stream of 14 bits is set as the address $H_l(p)$. Moreover, for example, in a case where the FFT mode is the 32K mode, the bit stream $R_i$ of 14 bits and the bit stream $G_k$ of 14 bits are produced, and the bit as 0 or 1 is added to the most significant bit (MSB) which is obtained from the exclusive OR (XOR) between the bit stream $R_i$ of 14 bits and the bit stream $G_k$ of 14 bits. The resulting bit stream of 15 bits is set as the address $H_l(p)$.

In a case where the address production expression (Expression (4)) of B of FIG. 17 is applied in such a manner, after the exclusive OR (XOR) between the second term and the third term of the right side is obtained, the bit as 0 or 1 is added as the most significant bit (MSB) thereof. Therefore, with respect to the most significant bit, 0 and 1 are toggled and 0 is necessarily obtained once a twice. For this reason, it is guaranteed that in the address producing portion 121, the valid address $H_f(p)$ is produced once a twice. As a result, the valid address can be more reliably produced.

It should be noted that Expression (2) to Expression (4) described above are an example of the address production expression after correction. As long as any of address production expressions is one which can guarantee that the valid address $H_f(p)$ is necessarily produced once a twice, other address production expressions may be adopted. In addition, the address production expression after correction described above has been described by giving, as an example, the case where the valid address $H_f(p)$ is produced at least once a twice. For example, however, if the valid address $H_f(p)$ is produced at the certain determined number of times such as once every three times or once in four times, then, it is guaranteed when the valid address $H_f(p)$ is produced. Therefore, for example, such an address production expression after correction as to produce the valid address $H_f(p)$ at the certain determined number of times such as once every three times or once in four times may be used. That is, it is only necessary that in the address production expression after correction, the valid address $H_f(p)$ is produced at a rate of at least once every n times (n is an integral number). However, the smaller value of n is said as being more preferable.

<4. Outline of Frequency Deinterleave>

The above description has been given with respect to the frequency interleave which is carried out by the frequency interleaver 111 of the transmission apparatus 10 on the transmission side. However, the similar address production is carried out in the frequency deinterleave as well which is carried out by the frequency deinterleaver of the reception apparatus 20 on the reception side.

(Configuration of Frequency Deinterleaver)

Figure 18:
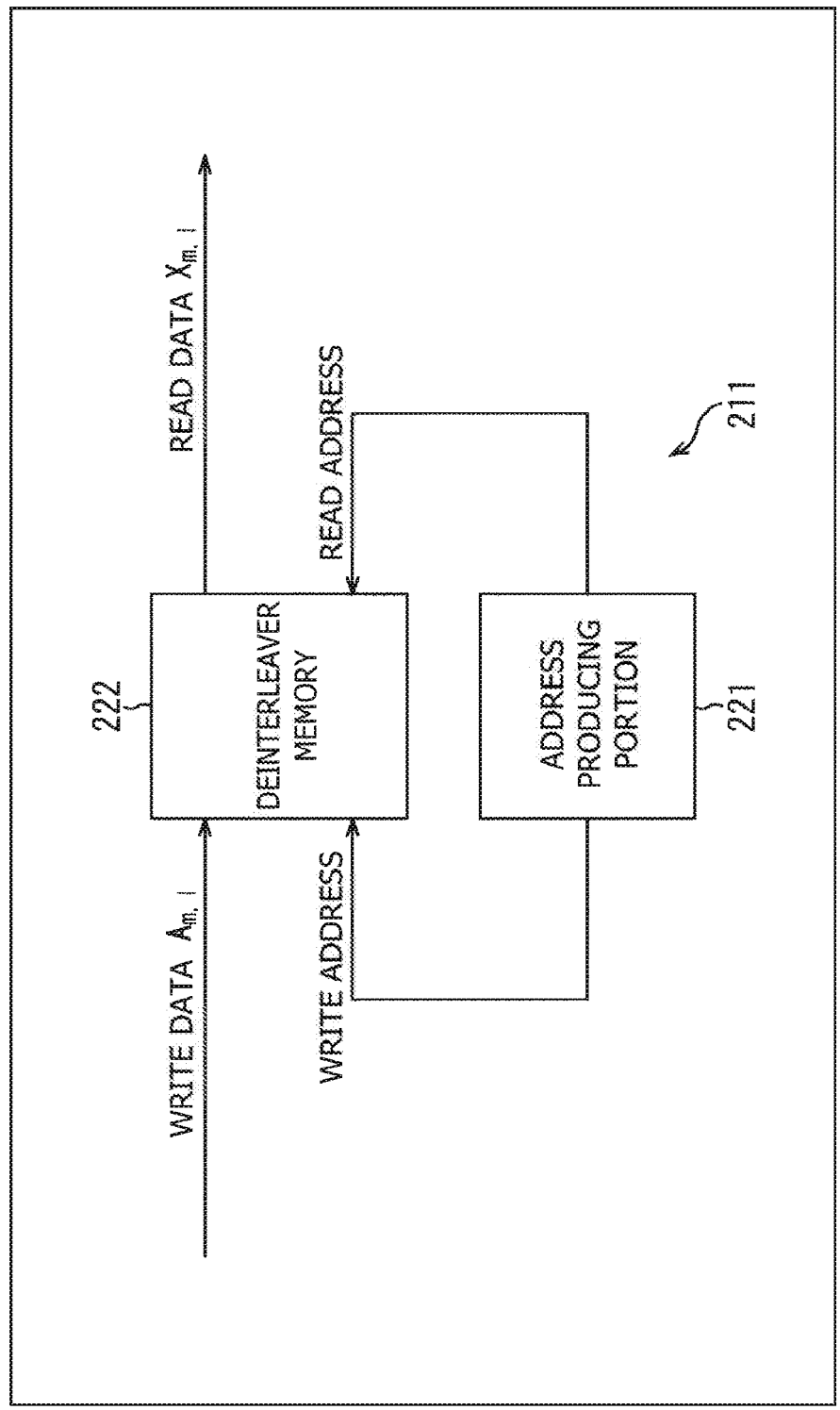
FIG. 18 is a block diagram depicting an example of a configuration of a frequency deinterleaver.

FIG. 18 is a block diagram depicting an example of a configuration of a frequency deinterleaver 211 included in (the processing portion 202 of) the reception apparatus 20 of FIG. 1.

In FIG. 18, the frequency deinterleaver 211 includes an address producing portion 221 and a deinterleaver memory 222.

The address producing portion 221 produces a write address in accordance with which write data $A_{m,l}$ inputted from a circuit in a preceding stage is written to the deinterleaver memory 222, and supplies the write address to the deinterleaver memory 222. As a result, the write data $A_{m,l}$ is written to the deinterleaver memory 222 in accordance with the write address from the address producing portion 221.

In addition, the address producing portion 221 produces a read address in accordance with which the data written to the deinterleaver memory 222 is read out as read data $X_{m,l}$, and supplies the read address to the deinterleaver memory 222. As a result, the read data $X_{m,l}$ is read out from the deinterleaver memory 222 in accordance with the read address from the address producing portion 221, and the read data $X_{m,l}$ is outputted to a circuit in a subsequent stage.

In this way, in the frequency deinterleaver 211, the address producing portion 221 produces the write address when the objective data is written to the deinterleaver memory 222, and the read address when the objective data is read out from the deinterleaver memory 222 in such a way that the write address and the read address are different from each other. As a result, the deinterleave in the frequency direction is carried out.

In this case, the address production is carried out in such a way that, for example, with respect to the objective data, at the time of the frequency interleave of the frequency interleaver 111, the read address produced by the address producing portion 121 agrees with the write address produced by the address producing portion 221, and the write address produced by the address producing portion 121 agrees with the read address produced by the address producing portion 221.

In addition, the address producing portion 221 of the frequency deinterleaver 211 has the similar configuration to that of the address producing portion 121 of the frequency interleaver 111 and, for example, can adopt the similar configuration as that of FIG. 16 described above. That is, the address producing portion 221 can produce the write address and the read address from the address production expression after correction of Expression (2) described above. However, Expression (2) is an example of the address production expression after correction. Thus, the address producing portion 221 may produce the address from, for example, Expression (3) or Expression (4) described above.

<5. Flow of Processing on Transmission Side and Reception Side>

Figure 19:
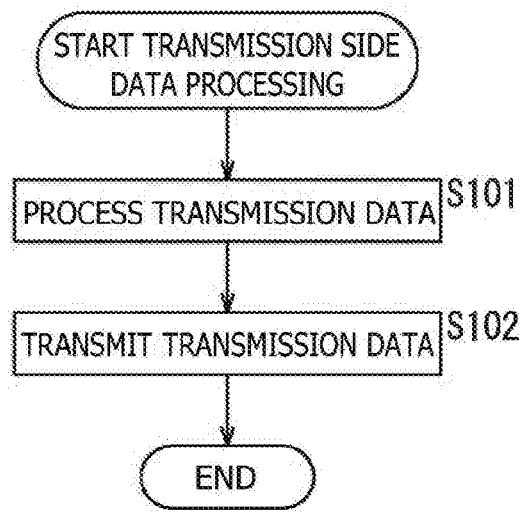
FIG. 19 is a flow chart explaining a flow of transmission side data processing.
Figure 20:
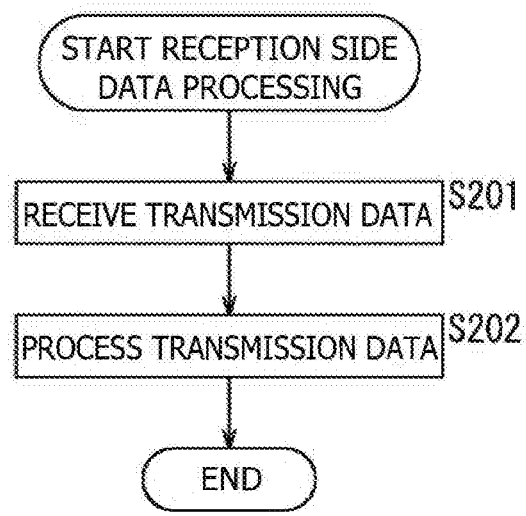
FIG. 20 is a flow chart explaining a flow of reception side data processing.

Next, a description will be given with respect to a flow of pieces of processing which are executed in the transmission apparatus 10 on the transmission side, and the reception apparatus 20 on the reception side, individually, in the transmission system 1 of FIG. 1 with reference to flow charts of FIG. 19 and FIG. 20.

(Data Processing on Transmission Side)

Firstly, a description will be given with respect to the flow of the data processing on the transmission side executed in the transmission apparatus 10 of FIG. 1 with reference to the flow chart of FIG. 19.

In Step S101, the processing portion 101 processes the transmission data inputted thereto.

In this case, after, for example, the transmission data is encapsulated in the transmission packet, and error correction encoding processing such as BCH encoding or LDPC encoding is executed, the bit interleave is carried out. In addition, the quadrature modulation corresponding to the predetermined modulation system, and the interleave in the time direction or in the frequency direction is carried out for the resulting data.

Here, the frequency interleave is carried out by the frequency interleaver 111 (FIG. 2 or FIG. 4). In the frequency interleaver 111, the write data is written to the interleaver memory 122 in accordance with the write address produced by the address producing portion 121, and the read data is read out from the interleaver memory 122 in accordance with the read address produced by the address producing portion 121, thereby carrying out the interleave in the frequency direction. However, the address producing portion 121, for example, carries out the address production in response to the address production expression after correction such as Expression (2) to Expression (4) described above.

In Step S102, the transmission portion 102 transmits the transmission data processed in Step S101.

In this case, for example, the processing regarding a symbol or a preamble of a pilot, and a guard interval in addition to IFFT is executed, and the OFDM signal corresponding to the frame is produced and is transmitted through the transmission path 30.

Hereinabove, the flow of the data processing on the transmission side has been described. In the data processing on the transmission side, in carrying out the frequency interleave, the address producing portion 121 of the frequency interleaver 111 carries out the address production in response to the address production expression after correction such as Expression (2) to Expression (4) described above. Therefore, it is guaranteed that in carrying out the address production, the valid address is produced at least once a twice. As a result, in the frequency interleave, the valid address can be more reliably produced.

(Data Processing on Reception Side)

Next, a description will now be given with respect to the flow of the data processing on the reception side which is executed in the reception apparatus 20 of FIG. 1 with reference to a flow chart of FIG. 20.

In Step S201, the reception portion 201 receives the transmission data transmitted thereto from the transmission apparatus 10 through the transmission path 30.

In this case, for example, the processing regarding a symbol or a preamble of a pilot, and a guard interval in addition to FFT is executed, and the data is extracted from the OFDM signal which is transmitted through the transmission path 30.

In Step S202, the processing portion 202 processes the transmission data received in Step S201.

In this case, for example, the deinterleave in the frequency direction or in the time direction is carried out for the data received in Step S201. In addition, after the quadrature demodulation corresponding to the predetermined modulation system is carried out, and the bit deinterleave is carried out for the resulting data, the error correction decoding processing such as the LDPC decoding or the BCH decoding. Then, the transmission data stored in the transmission packet is extracted, and is outputted to the decoding portion or the like in a subsequent stage.

Here, the frequency deinterleave is carried out by the frequency deinterleaver 211 (FIG. 18). In the frequency deinterleaver 211, the write data is written to the deinterleaver memory 222 in accordance with the write address produced by the address producing portion 221, and the read data is read out from the deinterleaver memory 222 in accordance with the read address produced by the address producing portion 221, thereby carrying out the deinterleave in the frequency direction. However, the address producing portion 221, for example, carries out the address production in response to the address production expression after correction such as Expression (2) to Expression (4) described above.

Hereinabove, the flow of the data processing on the reception side has been described. In the data processing on the reception side, in carrying out the frequency deinterleave, the address producing portion 221 of the frequency deinterleaver 211 carries out the address production in response to the address production expression after correction such as Expression (2) to Expression (4) described above. Therefore, it is guaranteed that at the time of the address production, the valid address is produced at least once a twice. As a result, in the frequency deinterleave, the valid address can be more reliably produced.

<6. Modified Changes>

As the above description, ATSC (especially, ATSC3.0) as the system adopted in U.S.A. or the like has been described as the standards for the digital broadcasting. However, the present technique may also be applied to ISDB (Integrated Services Digital Broadcasting) as the system adopted in Japan or the like, or DVB (Digital Video Broadcasting) as the system adopted in the countries of Europe. In addition, although in the above description, ATSC3.0 in which the IP transmission system is adopted has been described as the example, not limited to the IP transmission system, the present technique may, for example, also be applied to other system such as MPEG2-TS (Transport Stream).

In addition, with respect to the digital broadcasting, the present technique can be applied to the satellite broadcasting utilizing the broadcasting satellite (BS), the communication satellite (CS) or the like, the cable broadcasting such as the cable television (CATV), or the like in addition to the terrestrial broadcasting.

Moreover, the present technique can also be applied to the predetermined standards (the standards other than the standards for the digital broadcasting) which are regulated on the assumption that the transmission path other than the broadcasting network, that is, for example, the communication line (communication network) such as the Internet or the telephone network is utilized as the transmission path. In this case, the communication line such as the Internet or the telephone network is utilized as the transmission path 30 of the transmission system 1 (FIG. 1), and the transmission apparatus 10 can be used as the server provided on the Internet. Then, the reception apparatus 20 is made to have the communication function, so that the transmission apparatus 10 (server) executes the processing in response to the request made from the reception apparatus 20. On the other hand, the reception apparatus 20 shall process the data transmitted thereto from the transmission apparatus 10 (server) through the transmission path 30 (communication line).

In addition, although in the above description, the frequency interleave has been described, the frequency interleave is an example of the interleave to which the present technique is applied. Thus, in other interleave in which the address production is carried out at the time of the interleave, at the time of production of the address, the address production may be carried out in response to the address production expression after correction described above (for example, Expression (2) to Expression (4)). Likewise, the frequency deinterleave is an example of the deinterleave to which the present technique is applied, and thus the present technique can also be applied to other deinterleave.

<7. Configuration of Computer>

Figure 21:
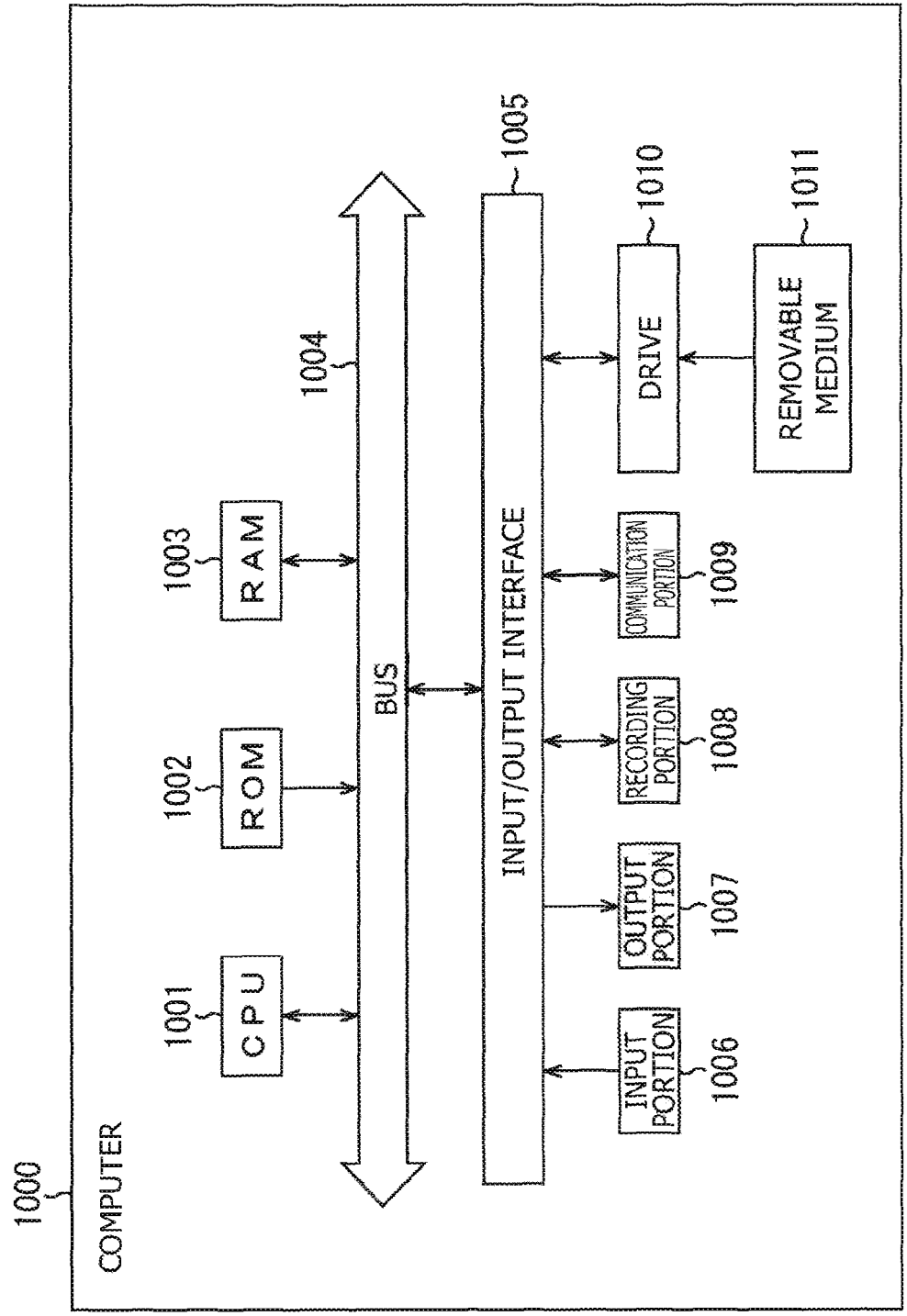
FIG. 21 is a block diagram depicting an example of a configuration of a computer.

The series of pieces of processing described above can be executed by the hardware, or by the software. In a case where the series of pieces of processing are executed by the software, the program constituting that software is installed in the computer. FIG. 21 is a block diagram depicting an example of a configuration of hardware of a computer which executes the series of pieces of processing in accordance with a program.

In a computer 1000, a CPU (Central Processing Unit) 1001, a ROM (Read Only Memory) 1002, and a RAM (Random Access Memory) 1003 are connected to one another through a bus 1004. An input/output interface 1005 is further connected to the bus 1004. An input portion 1006, an output portion 1007, a recording portion 1008, a communication portion 1009, and a drive 1010 are connected to the input/output interface 1005.

The input portion 1006 includes a keyboard, a mouse, a microphone, or the like. The output portion 1007 includes a display, a speaker, or the like. The recording portion 1008 includes a hard disk, a nonvolatile memory, or the like. The communication portion 1009 includes a network interface, or the like. The drive 1010 drives a removable medium 1011 such as a magnetic disk, an optical disk, a magneto-optical disk or a semiconductor memory.

In the computer 1000 configured in the manner as described above, the CPU 1001 loads the program recorded in the ROM 1002 or the recording portion 1008 into the RAM 1003 through the input/output interface 1005 and the bus 1004, and executes the program, thereby executing the series of pieces of processing described above.

The program which is to be executed by the computer 1000 (CPU 1001), for example, can be recorded in the removable medium 1011 as a package medium or the like to be provided. In addition, the program can be provided through a wired or wireless transmission medium such as a local area network, the Internet, or digital satellite broadcasting.

In the computer 1000, by mounting the removable medium 1011 to the drive 1010, the program can be installed in the recording portion 1008 through the input/output interface 1005. In addition, the program can be received in the communication portion 1009 through a wired or wireless transmission medium, thereby being installed in the recording portion 1008. In addition thereto, the program can be installed in the ROM 1002 or the recording portion 1008 in advance.

Here, in the present description, the processing which the computer is to execute in accordance with the program is not necessarily executed in time series along the order described as the flow chart. That is, the processing which the computer is to execute in accordance with the program includes the processing which is to be executed in parallel or independently (for example, the parallel processing or the processing by an object). In addition, the program may be one which is to be processed by one computer (processor), or may be one which is to be dispersedly processed by a plurality of computers.

It should be noted that the embodiment of the present technique is by no means limited to the embodiment described above, and various changes can be made without departing from the subject matter of the present technique.

In addition, the present technique can adopt the following configurations.

(1)

A data processing apparatus including:
- a frequency interleaver that includes an interleaver memory for writing and reading data, and an address producing portion configured to produce a write address and a read address, and that writes the data to the interleaver memory in accordance with the write address and reads out the data from the interleaver memory in accordance with the read address, thereby carrying out frequency interleave,
- in which the address producing portion includes
  - a first pseudo random number generating portion configured to produce a first bit stream as a random bit stream,
  - a second pseudo random number generating portion configured to produce a second bit stream as a random bit stream, and
  - a bit producing portion configured to alternately produce a bit as 0 and a bit as 1 as an additional bit added to a most significant bit of a random bit stream, and
- when the first bit stream, the second bit stream, and the additional bit are calculated to produce the write address or the read address including the random bit stream, the bit as 0 and the bit as 1 are alternately repeated as the most significant bit in the random bit stream.

(2)

The data processing apparatus according to (1), in which when the first bit stream is represented by $R_i$, the second bit stream is represented by $G_k$, an index of an address is i, a value decided in response to an FFT mode is $N_r$, a number of a symbol within a sub-frame included in a physical layer frame is l, and a number of a cell within a symbol is p, an address $H_l(p)$ is decided by following Expression:

$$H_l(p) = [(i \bmod 2)2^{N_r-1} + \Sigma_{j=0}^{N_r-2} R_i[j]2^j] \oplus \Sigma_{j=0}^{N_r-1} G_{[l/2]}[j]2^j \quad \text{[Math. 2]}$$

(where i mod 2 represents a rest when i is divided by 2, and 13 in an 8K mode, 14 in a 16K mode, and 15 in a 32K mode are individually set to $N_r$ in response to an FFT mode).

(3)

The data processing apparatus according to (1), in which when the first bit stream is represented by $R_i$, the second bit stream is represented by $G_k$, an index of an address is i, values decided in response to an FFT mode are $N_r$ and $M_{max}$, a number of a symbol within a sub-frame included in a physical layer frame is l, and a number of a cell within a symbol is p, an address $H_l(p)$ is decided by following Expression:

$$H_l(p) = (i \bmod 2)2^{N_r-1} + [\Sigma_{j=0}^{N_r-2} R_i[j]2^j + \Sigma_{j=0}^{N_r-2} G_{[l/2]}[j]2^j](\bmod M_{max}/2) \quad \text{[Math. 3]}$$

(where i mod 2 represents a rest when i is divided by 2, and 13 and 8192 in an 8K mode, 14 and 16384 in a 16K mode, and 15 and 32768 in a 32K mode are individually set to $N_r$ and $M_{max}$ in response to an FFT mode).

(4)

The data processing apparatus according to (1), in which when the first bit stream is represented by $R_i$, the second bit stream is represented by $G_k$, an index of an address is i, a value decided in response to an FFT mode is $N_r$, a number of a symbol within a sub-frame included in a physical layer frame is l, and a number of a cell within a symbol is p, an address $H_l(p)$ is decided by following Expression:

$$H_l(p) = (i \bmod 2)2^{N_r-1} + [\Sigma_{j=0}^{N_r-2} R_i[j]2^j \oplus \Sigma_{j=0}^{N_r-2} G_{[l/2]}[j]2^j] \quad \text{[Math. 4]}$$

(where i mod 2 represents a rest when i is divided by 2, and 13 in an 8K mode, 14 in a 16K mode, and 15 in a 32K mode are individually set to $N_r$ in response to an FFT mode).

(5)

A data processing method for a data processing apparatus including a frequency interleaver that includes an interleaver memory for writing and reading data, and an address producing portion configured to produce a write address and a read address, and that writes the data to the interleaver memory in accordance with the write address and reads out the data from the interleaver memory in accordance with the read address, thereby carrying out frequency interleave,
  the address producing portion including
    a first pseudo random number generating portion configured to produce a first bit stream as a random bit stream,
    a second pseudo random number generating portion configured to produce a second bit stream as a random bit stream, and
    a bit producing portion configured to alternately produce a bit as 0 and a bit as 1 as an additional bit added to a most significant bit of a random bit stream, the data processing method including the step of:
when the address producing portion calculates the first bit stream, the second bit stream, and the additional bit to produce the write address or the read address including the random bit stream, making the bit as 0 and the bit as 1 alternately repeat as the most significant bit in the random bit stream.

(6)
A data processing apparatus including:
a frequency deinterleaver that includes a deinterleaver memory for writing and reading data, and an address producing portion configured to produce a write address and a read address, and that writes the data to the deinterleaver memory in accordance with the write address and reads out the data from the deinterleaver memory in accordance with the read address, thereby carrying out frequency deinterleave,
in which the address producing portion includes
a first pseudo random number generating portion configured to produce a first bit stream as a random bit stream,
a second pseudo random number generating portion configured to produce a second bit stream as a random bit stream, and
a bit producing portion configured to alternately produce a bit as 0 and a bit as 1 as an additional bit added to a most significant bit of a random bit stream, and
when the first bit stream, the second bit stream, and the additional bit are calculated to produce the write address or the read address including the random bit stream, the bit as 0 and the bit as 1 are alternately repeated as the most significant bit in the random bit stream.

(7)
The data processing apparatus according to (6), in which when the first bit stream is represented by $R_i$, the second bit stream is represented by $G_k$, an index of an address is i, a value decided in response to an FFT mode is $N_r$, a number of a symbol within a sub-frame included in a physical layer frame is l, and a number of a cell within a symbol is p, an address $H_l(p)$ is decided by following Expression:

$$H_l(p)=[(i \bmod 2)2^{N_r-1}+\Sigma_{j=0}^{N_r-2}R_i[j]2^j]\oplus\Sigma_{j=0}^{N_r-1}G_{[l,2]}[j]2^j \quad [\text{Math. 2}]$$

(where i mod 2 represents a rest when i is divided by 2, and 13 in an 8K mode, 14 in a 16K mode, and 15 in a 32K mode are individually set to $N_r$ in response to an FFT mode).

(8)
The data processing apparatus according to (6), in which when the first bit stream is represented by $R_i$, the second bit stream is represented by $G_k$, an index of an address is i, values decided in response to an FFT mode are $N_r$ and $M_{max}$, a number of a symbol within a sub-frame included in a physical layer frame is l, and a number of a cell within a symbol is p, an address $H_l(p)$ is decided by following Expression:

$$H_l(p)=(i \bmod 2)2^{N_r-1}+[\Sigma_{j=0}^{N_r-2}R_i[j]2^j+\Sigma_{j=}^{N_r-2}G_{[l/2]}[j]2^j](\bmod M_{max}/2) \quad [\text{Math. 3}]$$

(where i mod 2 represents a rest when i is divided by 2, and 13 and 8192 in an 8K mode, 14 and 16384 in a 16K mode, and 15 and 32768 in a 32K mode are individually set to $N_r$ and $M_{max}$ in response to an FFT mode).

(9)
The data processing apparatus according to (6), in which when the first bit stream is represented by $R_i$, the second bit stream is represented by $G_k$, an index of an address is i, a value decided in response to an FFT mode is $N_r$, a number of a symbol within a sub-frame included in a physical layer frame is l, and a number of a cell within a symbol is p, an address $H_l(p)$ is decided by following Expression:

$$H_l(p)=(i \bmod 2)2^{N_r-1}+[\Sigma_{j=0}^{N_r-2}R^i[j]2^j\oplus\Sigma_{j=0}^{N_r-2}G_{[l/2]}[j]2^j] \quad [\text{Math. 4}]$$

(where i mod 2 represents a rest when i is divided by 2, and 13 in an 8K mode, 14 in a 16K mode, and 15 in a 32K mode are individually set to $N_r$ in response to an FFT mode).

(10)
A data processing method for a data processing apparatus including a frequency deinterleaver that includes a deinterleaver memory for writing and reading data, and an address producing portion configured to produce a write address and a read address, and that writes the data to the deinterleaver memory in accordance with the write address and reads out the data from the deinterleaver memory in accordance with the read address, thereby carrying out frequency deinterleave,
the address producing portion including
a first pseudo random number generating portion configured to produce a first bit stream as a random bit stream,
a second pseudo random number generating portion configured to produce a second bit stream as a random bit stream, and
a bit producing portion configured to alternately produce a bit as 0 and a bit as 1 as an additional bit added to a most significant bit of a random bit stream,
the data processing method including the step of:
when the address producing portion calculates the first bit stream, the second bit stream, and the additional bit to produce the write address or the read address including the random bit stream, making the bit as 0 and the bit as 1 alternately repeat as the most significant bit in the random bit stream.

REFERENCE SIGNS LIST

1 . . . Transmission system, 10 . . . Transmission apparatus, 20 . . . Reception apparatus, 30 . . . Transmission path, 101 . . . Processing portion, 102 . . . Transmission portion, 111 . . . Frequency interleaver, 121 . . . Address producing portion, 122 . . . Interleaver memory, 131 . . . Control portion, 132 . . . Pseudo random number generating portion, 133 . . . Bit producing portion, 134 . . . Pseudo random number generating portion, 135 . . . Offset calculating portion, 136 . . . Address checking portion, 141 . . . Exclusive OR calculating portion, 201 . . . Reception portion, 202 . . . Processing portion, 211 . . . Frequency deinterleaver, 221 . . . Address producing portion, 222 . . . Deinterleaver memory, 1000 . . . Computer, 1001 . . . CPU

The invention claimed is:
1. A data processing apparatus comprising:
frequency interleaver circuitry that includes an interleaver memory for writing and reading data, and an address producing portion configured to produce a write address and a read address, and that writes the data to the interleaver memory in accordance with the write address and reads out the data from the interleaver memory in accordance with the read address, thereby carrying out frequency interleave, wherein the address producing portion includes
   a first pseudo random number generating portion configured to produce a first random bit stream,
   a second pseudo random number generating portion configured to produce a second random bit stream,
   a bit producing portion configured to alternately produce a bit as 0 and a bit as 1 as an additional bit added as most significant bit of the first random bit stream, and
   a calculating portion configured to produce the write address or the read address by obtaining an exclusive-OR between the first random bit stream and the second random bit stream.
   when the first random bit stream, the second random bit stream, and the additional bit are calculated to produce the write address or the read address, the bit as 0 and the bit as 1 are alternately repeated as the most significant bit in the first random bit stream.

2. The data processing apparatus according to claim 1, wherein
   when the first random bit stream is represented by $R_i$, the second random bit stream is represented by $G_k$, an index of an address is i, a value decided in accordance with an FFT mode is $N_r$, a number of a symbol within a sub-frame included in a physical layer frame is 1, and a number of a cell within a symbol is p, an address $H_l(p)$ is decided by following Expression:

$$H_l(p) = [(i \bmod 2)2^{N_r-1} + \Sigma_{j=0}^{N_r-2} R_i[j]2^j] \oplus \Sigma_{j=0}^{N_r-1} G_{[1/2]}[j]2^j,$$

and
   i mod 2 represents a rest when i is divided by 2, and $N_r$ is 13 in an 8K FFT mode, 14 in a 16K FFT mode, and 15 in a 32K FFT mode.

3. The data processing apparatus according to claim 1, wherein
   when the first random bit stream is represented by the second random bit stream is represented by $G_k$, an index of an address is i, a value decided in accordance with to an FFT mode is $N_r$, a number of a symbol within a sub-frame included in a physical layer frame is 1, and a number of a cell within a symbol is p, an address $H_l(p)$ is decided by following Expression:

$$H_l(p) = (i \bmod 2)2^{N_r-1} + [\Sigma_{j=0}^{N_r-2} R_i[j]2^j \oplus \Sigma_{j=0}^{N_r-2} G_{[1/2]}[j]2^j],$$

and
   i mod 2 represents a rest when i is divided by 2, and $N_r$ is 13 in an 8K FFT mode, 14 in a 16K FFT mode, and 15 in a 32K FFT mode.

4. A data processing method for a data processing apparatus including frequency interleaver circuitry that includes an interleaver memory for writing and reading data, and an address producing portion configured to produce a write address and a read address, and that writes the data to the interleaver memory in accordance with the write address and reads out the data from the interleaver memory in accordance with the read address, thereby carrying out frequency interleave,
   the address producing portion including
      a first pseudo random number generating portion configured to produce a first random bit stream,
      a second pseudo random number generating portion configured to produce a second random bit stream, and
      a bit producing portion configured to alternately produce a bit as 0 and a bit as 1 as an additional bit added as a most significant bit of the first random bit stream,
   the data processing method comprising:
      calculating the write address or the read address by obtaining an exclusive-OR between the first random bit stream and the second random bit stream.

5. The data processing method according to claim 4, wherein
   when the first random bit stream is represented by $R_1$, the second random bit stream is represented by $G_k$, an index of an address is i, a value decided in accordance with an FFT mode is $N_r$, a number of a symbol within a sub-frame included in a physical layer frame is 1, and a number of a cell within a symbol is p, an address $H_l(p)$ is decided by following Expression:

$$H_l(p) = [(i \bmod 2)2^{N_r-1} + [\Sigma_{j=0}^{N_r-2} R_i[j]2^j] \oplus \Sigma_{j=0}^{N_r-2} G_{[1/2]}[j]2^j,$$

and
   i mod 2 represents a rest when i is divided by 2, and $N_r$ is 13 in an 8K FFT mode, 14 in a 16K FFT mode, and 15 in a 32K FFT mode.

6. The data processing method according to claim 4, wherein
   when the first random bit stream is represented by $R_i$, the second random bit stream is represented by $G_k$, an index of an address is i, a value decided in accordance with an FFT mode is $N_r$, a number of a symbol within a sub-frame included in a physical layer frame is 1, and a number of a cell within a symbol is p, an address $H_l(p)$ is decided by following Expression:

$$H_l(p) = (i \bmod 2)2^{N_r-1} + [\Sigma_{j=0}^{N_r-2} R_i[j]2^j \oplus \Sigma_{j=0}^{N_r-2} G_{[1/2]}[j]2^j],$$

and
   i mod 2 represents a rest when i is divided by 2, and $N_r$ is 13 in an 8K FFT mode, 14 in a 16K FFT mode, and 15 in a 32K FFT mode.

7. A data processing apparatus comprising:
   frequency deinterleaver circuitry that includes a deinterleaver memory for writing and reading data, and an address producing portion configured to produce a write address and a read address, and that writes the data to the deinterleaver memory in accordance with the write address and reads out the data from the deinterleaver memory in accordance with the read address, thereby carrying out frequency deinterleave,
   wherein the address producing portion includes
      a first pseudo random number generating portion configured to produce a first random bit stream,
      a second pseudo random number generating portion configured to produce a second random bit stream,
      a bit producing portion configured to alternately produce a bit as 0 and a bit as 1 as an additional bit added as a most significant bit of the first random bit stream, and
      a calculating portion configured to produce the write address or the read address by obtaining an exclusive-OR between the first random bit stream and the second random bit stream.

8. The data processing apparatus according to claim 7, wherein
   when the first random bit stream is represented by $R_i$, the second random bit stream is represented by $G_k$, an index of an address is i, a value decided in accordance with an FFT mode is $N_r$, a number of a symbol within a sub-frame included in a physical layer frame is 1, and a number of a cell within a symbol is p, an address $H_l(p)$ is decided by following Expression:

$$H_l(p)=[(i \bmod 2)2^{N_r-1}+\Sigma_{j=0}^{N_r-2}R_i[j]2^j]\oplus\Sigma_{j=0}^{N_r-1}G_{[1/2]}[j]2^j,$$

and i mod 2 represents a rest when i is divided by 2, and $N_r$ is 13 in an 8K FFT mode, 14 in a 16K FFT mode, and 15 in a 32K FFT mode.

9. The data processing apparatus according to claim 7, wherein when the first random bit stream is represented by $R_i$, the second random bit stream is represented by $G_k$, an index of an address is i, a value decided in accordance with an FFT mode is $N_r$, a number of a symbol within a sub-frame included in a physical layer frame is 1, and a number of a cell within a symbol is p, an address $H_l(p)$ is decided by following Expression:

$$H_l(p)(i \bmod 2)2^{N_r-1}+[\Sigma_{j=0}^{N_r-2}R_i[j]2^j\oplus\Sigma_{j=0}^{N_r-2}G_{[1/2]}[j]2^j],$$

and i mod 2 represents a rest when i is divided by 2, and $N_r$ is 13 in an 8K FFT mode, 14 in a 16K FFT mode, and 15 in a 32K FFT mode.

10. A data processing method for a data processing apparatus including frequency deinterleaver circuitry that includes a deinterleaver memory for writing and reading data, and an address producing portion configured to produce a write address and a read address, and that writes the data to the deinterleaver memory in accordance with the write address and reads out the data from the deinterleaver memory in accordance with the read address, thereby carrying out frequency deinterleave, the address producing portion including
a first pseudo random number generating portion configured to produce a first random bit stream,
a second pseudo random number generating portion configured to produce a second random bit stream, and
a bit producing portion configured to alternately produce a bit as 0 and a bit as 1 as an additional bit added as a most significant bit of the first random bit stream, the data processing method comprising:
calculating the write address or the read address by obtaining an exclusive-OR between the first random bit stream and the second random bit stream.

11. The data processing method according to claim 10, wherein when the first random bit stream is represented by $R_i$, the second random bit stream is represented by $G_k$, an index of an address is i, a value decided in accordance with an FFT mode is $N_r$, a number of a symbol within a sub-frame included in a physical layer frame is 1, and a number of a cell within a symbol is p, an address $H_l(p)$ is decided by following Expression:

$$H_l(p)=[(i \bmod 2)2^{N_r-1}+[\Sigma_{j=0}^{N_r-2}R_i[j]2^j]\oplus\Sigma_{j=0}^{N_r-2}G_{[1/2]}[j]2^j,$$

and i mod 2 represents a rest when i is divided by 2, and $N_r$ is 13 in an 8K FFT mode, 14 in a16K FFT mode, and 15 in a 32K FFT mode.

12. The data processing method according to claim 10, wherein when the first random bit stream is represented by $R_i$, the second random bit stream is represented by $G_k$, an index of an address is i, a value decided in accordance with an FFT mode is $N_r$, a number of a symbol within a sub-frame included in a physical layer frame is 1, and a number of a cell within a symbol is p, an address $H_l(p)$ is decided by following Expression:

$$H_l(p)(i \bmod 2)2^{N_r-1}+[\Sigma_{j=0}^{N_r-2}R_i[j]2^j\oplus\Sigma_{j=0}^{N_r-2}G_{[1/2]}[j]2^j],$$

and i mod 2 represents a rest when i is divided by 2, and $N_r$ is 13 in an 8K FFT mode, 14 in a16K FFT mode, and 15 in a 32K FFT mode.

* * * * *

UNITED STATES PATENT AND TRADEMARK OFFICE
CERTIFICATE OF CORRECTION

PATENT NO. : 10,789,165 B2  
APPLICATION NO. : 15/754331  
DATED : September 29, 2020  
INVENTOR(S) : Makiko Yamamoto Page 1 of 1

It is certified that error appears in the above-identified patent and that said Letters Patent is hereby corrected as shown below:

On the Title Page

Item (73), the Assignee's information is incorrect. Item (73) should read:  
--(73) Assignee: Saturn Licensing LLC, New York, NY (US)--

Signed and Sealed this  
Fifteenth Day of December, 2020

Andrei Iancu  
*Director of the United States Patent and Trademark Office*